(12) United States Patent
Floyd

(10) Patent No.: US 9,484,809 B2
(45) Date of Patent: Nov. 1, 2016

(54) APPARATUS AND METHODS FOR LOW VOLTAGE HIGH PSRR SYSTEMS

(71) Applicant: Brian Harold Floyd, Sunnyvale, CA (US)

(72) Inventor: Brian Harold Floyd, Sunnyvale, CA (US)

(*) Notice: Subject to any disclaimer, the term of this patent is extended or adjusted under 35 U.S.C. 154(b) by 0 days.

(21) Appl. No.: 14/744,965

(22) Filed: Jun. 19, 2015

(65) Prior Publication Data

US 2015/0372592 A1 Dec. 24, 2015

Related U.S. Application Data

(60) Provisional application No. 62/015,417, filed on Jun. 21, 2014.

(51) Int. Cl.
*H02M 3/07* (2006.01)
*G11C 5/14* (2006.01)
*H02M 3/16* (2006.01)

(52) U.S. Cl.
CPC ............. *H02M 3/07* (2013.01); *G11C 5/145* (2013.01); *H02M 3/16* (2013.01)

(58) Field of Classification Search
CPC ........ H02M 3/07; H02M 3/16; H02M 3/073; G11C 5/145
See application file for complete search history.

(56) References Cited

U.S. PATENT DOCUMENTS

| 7,199,645 | B2* | 4/2007 | Chang | H02M 3/073 327/538 |
| 7,885,132 | B2* | 2/2011 | Kubo | G11C 5/145 365/185.18 |
| 8,487,660 | B2 | 7/2013 | Floyd | |
| 8,817,500 | B2* | 8/2014 | Lee | H02M 3/073 363/59 |
| 8,847,671 | B2 | 9/2014 | Floyd | |
| 8,917,136 | B1* | 12/2014 | Pelley | H02M 1/36 327/536 |
| 2007/0070725 | A1* | 3/2007 | Do | G11C 5/145 365/189.09 |

OTHER PUBLICATIONS

Pan, Feng, et al., "Charge Pump Circuit Design", McGraw-Hill Professional Publishing, dated Aug. 28, 2006. (pp. 135-136). ISBN: 0-07-147045-X.
Micrel, MIC61150 "Low Input Voltage, Single-Supply High-Current LDO", Datasheet Nov. 2010.

* cited by examiner

*Primary Examiner* — Jung Kim

(57) ABSTRACT

Provided herein are apparatus and methods for low voltage high power supply rejection ratio (PSRR) systems. A charge pump converts a supply voltage to a larger charge pump voltage and provides the charge pump voltage to a circuit subsystem. The charge pump voltage is regulated to a state dependent reference. In the steady state the charge pump voltage is regulated with respect to an output voltage of the circuit subsystem; in this way PSRR of the circuit subsystem is enhanced.

19 Claims, 16 Drawing Sheets

ABSTRACT

APPARATUS AND METHODS FOR LOW VOLTAGE HIGH PSRR SYSTEMS

CROSS-REFERENCE TO RELATED APPLICATION

This application claims the benefit under 35 U.S.C. §119 (e) of U.S. Provisional Application No. 62/015,417, filed Jun. 21, 2014, entitled "High Power-Supply-Rejection Regulators With Internal-Charge-Pump Systems," the entirety of which is hereby incorporated by reference.

BACKGROUND

1. Field

Embodiments of the invention relate to electronic systems, and more particularly, to low voltage electronic systems with charge pumps.

2. Description of the Related Technology

A charge pump can be used to convert a low voltage supply to a higher voltage supply rail for circuit blocks which normally would not operate at low voltage. One example of an integrated charge pump system is a load switch which receives an internal charge pump voltage in order to improve gate drive. The load switch can use an NMOS FET with a positive charge pump to provide a large gate-to-source voltage and to achieve a low on resistance. In another example a load switch can use a PMOS FET with a negative charge pump to provide a large gate-to-source voltage and to achieve a low on resistance.

SUMMARY

In one embodiment an apparatus comprises a supply node configured to receive a supply voltage and a charge pump configured to convert the supply voltage to a charge pump voltage. The apparatus also comprises a circuit subsystem configured to receive the charge pump voltage at a subsystem supply node and a charge pump regulation control module. The circuit subsystem provides an output voltage at an output node; also, the circuit subsystem is configured to transition from a subsystem transient state to a subsystem steady state. In the subsystem steady state, the circuit subsystem has a steady state output value. The charge pump regulation control module is configured to regulate the charge pump voltage with respect to a state dependent reference. The state dependent reference has a transient reference value and a steady state reference value. The steady state reference value is the steady state output value.

In another embodiment an apparatus comprises a supply node configured to receive a supply voltage and a charge pump configured to convert the supply voltage to a charge pump voltage. The apparatus also comprises a circuit subsystem configured to operate in a transient state and a steady state. The circuit subsystem is configured to receive the charge pump voltage at a subsystem supply node and provides an output voltage at an output node. Also, the output voltage reaches a steady state output value in the steady state, and the steady state reference value is the steady state output value. Additionally, the apparatus comprises a charge pump regulation control module configured to regulate the charge pump voltage with respect to a voltage independent of the charge pump voltage during the transient state. The charge pump regulation control module is also configured to regulate the charge pump voltage with respect to the steady state output value in the steady state.

In another embodiment a method of operating a charge pump system comprises providing a supply voltage to a supply node of a charge pump and generating a charge pump voltage with the charge pump. The method of operating the charge pump system further comprises providing the charge pump voltage to a subcircuit supply node of a circuit subsystem and providing a subcircuit output voltage from the circuit subsystem. Also, the method of operating the charge pump system comprises regulating the charge pump voltage with respect to a transient reference value during a transient state before the subcircuit output voltage reaches a steady state output value; and the method of operating the charge pump system comprises regulating the charge pump voltage with respect to the subcircuit output value during a steady state after the subcircuit output voltage reaches the steady state output value.

BRIEF DESCRIPTION OF THE DRAWINGS

These drawings and the associated description herein are provided to illustrate specific embodiments of the invention and are not intended to be limiting.

DETAILED DESCRIPTION OF EMBODIMENTS

Figure 1A:
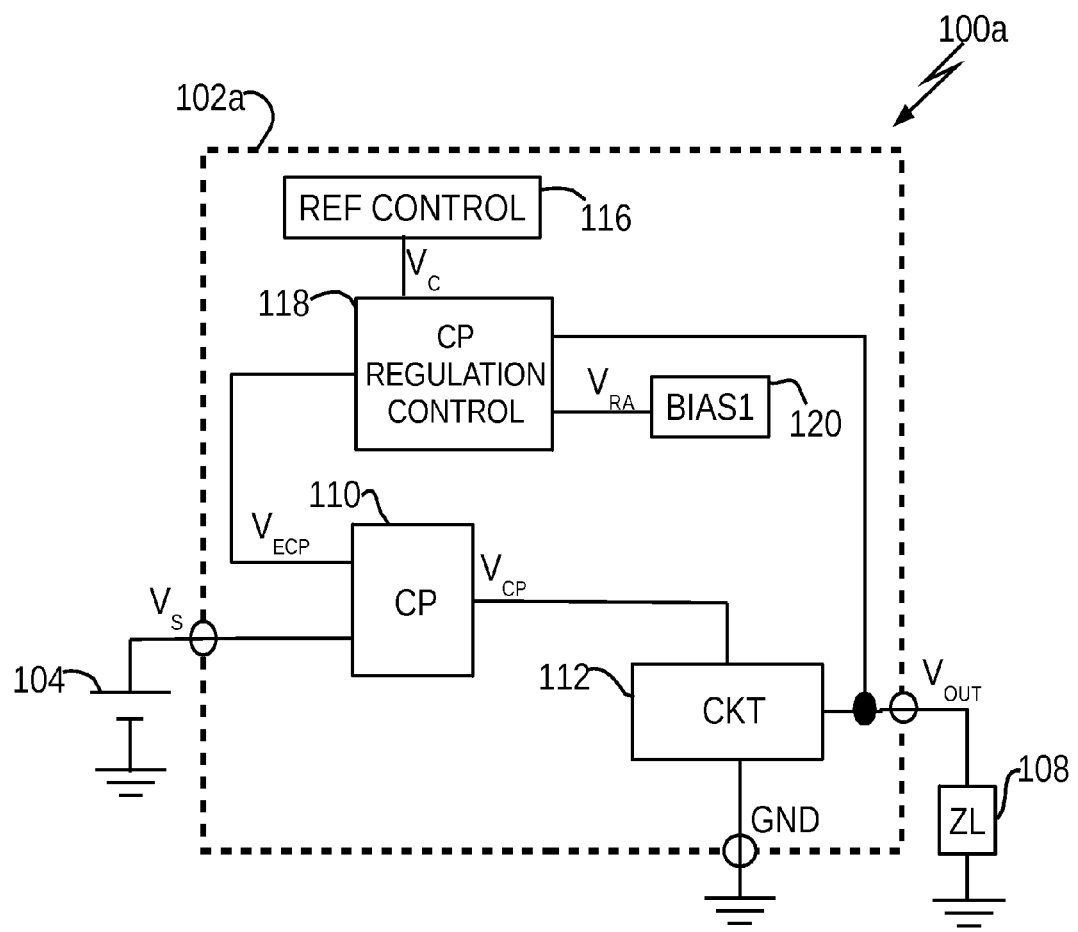
FIG. 1A is a schematic diagram of a low voltage system using a regulated charge pump system in accordance with the teachings herein.

The following detailed description of embodiments presents various descriptions of specific embodiments of the invention. However, the invention can be embodied in a multitude of different ways as defined and covered by the claims. In this description, reference is made to the drawings in which like reference numerals may indicate identical or functionally similar elements.

Portable products such as cell phones have influenced the market trend for circuits and systems operating at low voltages. Circuits, including op-amps (operational amplifiers) have been developed for operation at voltages approaching one volt. Environmental concerns are further pushing the one volt limit lower as there becomes a need for environmentally "Green" circuits operating from solar cells with single cell voltages less than half of one volt. Circuit designs realized in bipolar processes have availed circuits and systems operating down to voltage levels approaching one volt; however, because bipolar junction transistors (BJTs) are inherently current controlled devices, many circuits realized using BJTs operate with higher quiescent current than circuits realized using standard CMOS (complementary metal oxide semiconductor) processes.

The design approaches for CMOS circuits and systems, including analog circuits and systems, operating at voltages greater than one volt abound in the archives of circuit texts and journals. The advantages of circuits using CMOS devices realized in CMOS processes, compared to those using BJTs, include lower quiescent current and lower power demand. Additional advantages of CMOS circuits and systems include low processing costs, maturity as a well researched technology, and excellent performance. These circuits and analog circuits realized in standard CMOS processes can require supply voltages greater than one volt.

Accordingly, there is a need to combine the advantages of previously designed circuits and systems operating at voltages greater than one volt with less than one volt power supplies or solar cells.

Recent advances in charge pump circuits, also referred to as low voltage charge pumps or charge pumps, now allow the generation of larger charge pump voltages, either negative or positive, from smaller voltages, including voltages at the level of a single solar cell. For instance, a complete description of a charge pump operating from less than one volt power supplies can be found in Applicant's U.S. Pat. No. 8,847,671 B2 entitled "Methods and circuits for a low input voltage charge pump," published Sep. 30, 2014.

In a low voltage system receiving an external supply voltage of less than one volt, the low voltage charge pump can provide the charge pump voltage to each circuit or subcircuit which normally cannot operate from supply voltages less than one volt. As one of ordinary skill in the art can appreciate, subcircuits can also be referred to as subcircuit systems, circuit subsystems, or circuit blocks.

When used to generate a charge pump voltage as a supply rail (voltage) for a circuit or CMOS circuit, the charge pump voltage can vary with the supply voltage. The supply voltage provides power and is also referred to as the supply rail, input supply voltage or input voltage. For instance, a charge pump can be configured to generate a charge pump voltage equal to three volts when a supply voltage is half a volt; however, when unregulated, the same charge pump can generate a charge pump voltage as high as nine volts, in excess of device voltage ratings, when the supply voltage changes to three volts. Therefore, there is also a need to regulate the charge pump.

One approach to regulating the charge pump voltage is a voltage clamp. However, a voltage clamp can lead to unnecessarily large quiescent current and does not regulate the charge pump voltage for all input voltages. An alternative approach is to regulate the charge pump voltage to a reference voltage. As one of ordinary skill in the art can appreciate, a regulated charge pump voltage in this manner can supply a stable voltage rail to the subcircuit blocks; this in turn can advantageously improve the overall PSRR (power supply rejection ratio) of the system with respect to the input supply rail. Here the PSRR can also refer to the frequency dependent PSRR which is an important design specification in many circuit subsystems such as linear regulators.

A traditional method of regulating a charge pump voltage to a fixed reference, such as a bandgap reference, can be inefficient for charge pump systems operating from input voltages having a wide voltage range. For instance, a charge pump operating with an input voltage of 0.9V can require a fast oscillator to generate a regulated charge pump voltage of say 5V (five volts) output regulated. The same charge pump using the fast oscillator can inefficiently undergo greater switching losses due to the fast oscillator when the input voltage exceeds 2V (two volts).

Further, using a traditional method of regulating a charge pump voltage to a fixed reference can be problematic for internal subcircuits when the subcircuits provide regulated output voltages which are referenced to the input voltage. For instance, when the subcircuit is a linear regulator with an N-channel (NMOS) pass device, the drain of the NMOS can receive the input voltage while the gate of the NMOS can receive a voltage from a subcircuit operating from the charge pump voltage. Depending upon the output voltage provided at the source of the NMOS pass device, the charge pump voltage can exceed the gate to source voltage process limits on the pass device if it regulated to a fixed reference. In this case, regulating to a fixed reference can further limit the operation of the charge pump system. Accordingly, there is an need to regulate a charge pump voltage with respect to a reference which accounts for the output voltage of a subcircuit block.

Provided herein are apparatus and methods for low voltage high PSRR (power supply rejection ratio) systems. A low voltage charge pump can be used to create a supply rail (voltage) for a circuit or CMOS circuit such as an analog CMOS circuit which normally would not operate from supply voltages lower than one volt. The charge pump voltage is regulated to an output voltage of a subcircuit block within the circuit system to enhance performance and to improve charge pump operation. In order to bring the system to the steady state operating conditions, the charge pump voltage is regulated to a state dependent reference. Upon reaching a steady state the charge pump voltage is regulated with respect to an output voltage of the circuit subsystem; and in this way PSRR of the circuit subsystem is enhanced.

FIG. 1A is a schematic diagram of a low voltage system 100a using a regulated charge pump system 102a in accordance with the teachings herein. The low voltage system 100a includes a voltage source 104, the regulated charge pump system 102a, and a load 108. The voltage source 104 provides a supply voltage $V_S$ to the regulated charge pump system 102a at a supply node; the regulated charge pump system in turn provides the load 108 with an output voltage $V_{OUT}$ at an output port. Also as shown in FIG. 1A, the regulated charge pump system 102a has a ground port connected to ground GND. The supply voltage $V_S$ can be a low voltage supply such as a solar cell delivering less than one volt.

The regulated charge pump system 102a includes a charge pump 110, a circuit subsystem 112, a charge pump regulation control module 118, a first bias circuit 120, and a reference control module 116. The charge pump has an input port connected to the supply node of the regulated charge pump system 102a and has a charge pump output port electrically connected to a subsystem supply node of the circuit subsystem 112. The charge pump converts energy from the voltage source 104 and provides a charge pump voltage $V_{CP}$ to the subcircuit supply node of the circuit subsystem 112. The circuit subsystem 112 can be a circuit block or subcircuit which operates from voltages greater than the supply voltage $V_S$. For instance, the circuit subsystem 112 can be an operational amplifier (op-amp) or analog subsystem requiring a minimum of 2.5V, while the supply voltage $V_S$ can be less than one volt.

Also, as shown in FIG. 1A, the ground port of the regulated charge pump system 102a provides the ground GND (ground potential) to a ground port of the circuit subsystem 112. As one of ordinary skill in the art can appreciate, there can be additional blocks such as the first bias circuit 120, the charge pump 110, and the charge pump regulation control 118 which also have ground ports, not shown in FIG. 1A, electrically connected to ground.

There can be a transient state defined by a time period from when the regulated charge pump system 102a initially receives the supply voltage $V_S$ to when a signal such as the output voltage $V_{OUT}$ reaches a steady state value; and there can be a steady state defined by the time after which signals, including the output voltage $V_{OUT}$ have reached steady state. In the context of system theory, the circuit subsystem 112 can further have a subsystem transient state and a subsystem steady state defined by the state of the output voltage $V_{OUT}$. Those of ordinary skill in the art can further appreciate the meaning of steady state and transient state in this context.

The charge pump regulation control module 118 can provide a signal $V_{ECP}$ to the charge pump 110 so as to regulate the charge pump voltage $V_{CP}$ to a state dependent reference voltage. The reference control module 116 can provide a control signal $V_C$ to the charge pump regulation control module 118 to control which reference the charge pump regulation control module 118 actively uses during the transient state and during the steady state. As shown in FIG. 1A, the charge pump regulation control module 118 receives a first reference $V_{RA}$ from the first bias circuit 120 and the output voltage $V_{OUT}$ from the output port of the circuit subsystem 112. During the transient state, the reference control module 116 can provide the control signal $V_C$ to the charge pump regulation control module 118 so that the charge pump regulation control module 118 provides the signal $V_{ECP}$ based upon the first reference $V_{RA}$. During the steady state, the reference control module 116 can provide the control signal $V_C$ to the charge pump regulation control module 118 so that the charge pump regulation control module 118 provides the signal $V_{ECP}$ based upon the output voltage $V_{OUT}$.

The first reference $V_{RA}$ can further be referred to as a transient state reference value which can be a voltage dependent upon the supply voltage $V_S$. For instance, the first reference $V_{RA}$ can be derived from a simple resistor divider connected to the supply voltage $V_S$. The output voltage or the value of the output voltage, can be referred to as the steady state reference value. In this case, using the output voltage $V_{OUT}$ to regulate the charge pump voltage $V_{CP}$ can advantageously enhance the steady state performance of the circuit subsystem 112 with respect to the supply voltage $V_S$. For instance, the power supply rejection ratio (PSRR) defined by a relationship between variations of the output voltage $V_{OUT}$ to variations in the supply voltage $V_S$, can be greatly enhanced.

The signal $V_{ECP}$ can be a digital control signal which regulates the charge pump voltage $V_{CP}$ by controlling an enable condition of a charge pump oscillator. Those of ordinary skill in the art can recognize how a digital signal can be used to regulate a charge pump voltage by enabling and disabling an oscillator of a charge pump, and further details can be found in the reference Pan, Feng, et al. *Charge Pump Circuit Design* (pp. 135-136) McGraw-Hill Education, 2006.

As shown in FIG. 1A, the regulated charge pump system 102a can be a monolithic integrated circuit fabricated using a CMOS process. However, as one of ordinary skill in the art can appreciate, the regulated charge pump system 102a can also be realized using discrete components.

Figure 1B:
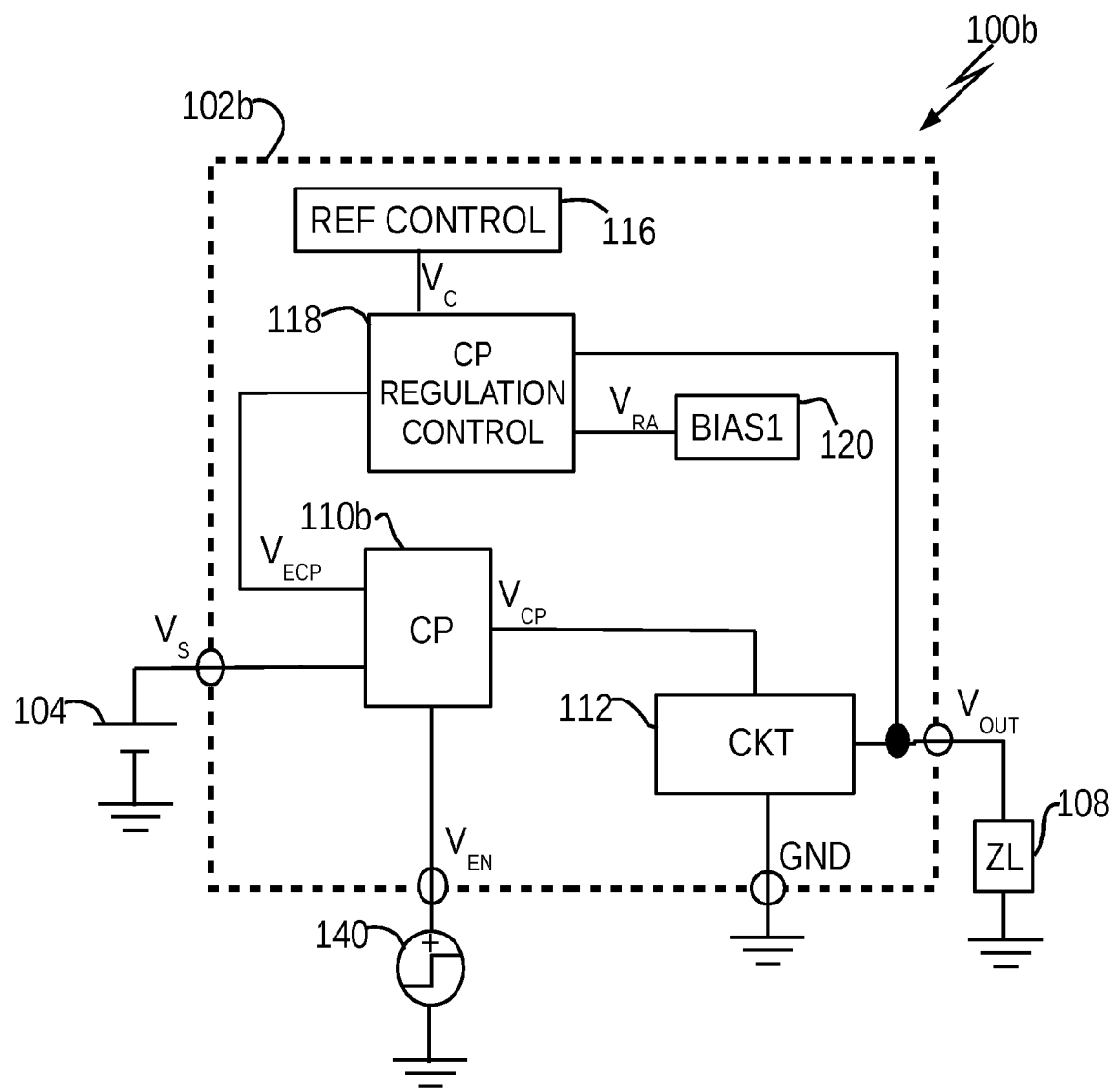
FIG. 1B is a schematic diagram of a low voltage system using a regulated charge pump system according to another embodiment.

FIG. 1B is a schematic diagram of a low voltage system 100b using a regulated charge pump system 102b according to another embodiment. The regulated charge pump system 102b is similar to the regulated charge pump system 102a of FIG. 1A, except in FIG. 1B the regulated charge pump system 102b receives an enable signal $V_{EN}$ from a signal source 140. In addition, the low voltage system 100b includes a charge pump 110b, which is similar to the charge pump 110 of FIG. 1A, except the charge pump 110b also receives the enable signal $V_{EN}$. Unlike the charge pump 110 of FIG. 1A, the charge pump 110b can be controlled to remain off until the enable signal $V_{EN}$ provides an enable true signal. As one of ordinary skill in the art can appreciate, the enable true signal can be a logic signal which enables an oscillator or control element within the charge pump 110b. Also, unlike the transient state of the low voltage system 100a, which can begin when the supply voltage $V_S$ is applied to the voltage node, the transient state of the low voltage system 100b can be controlled by the enable signal $V_{EN}$.

Figure 1C:
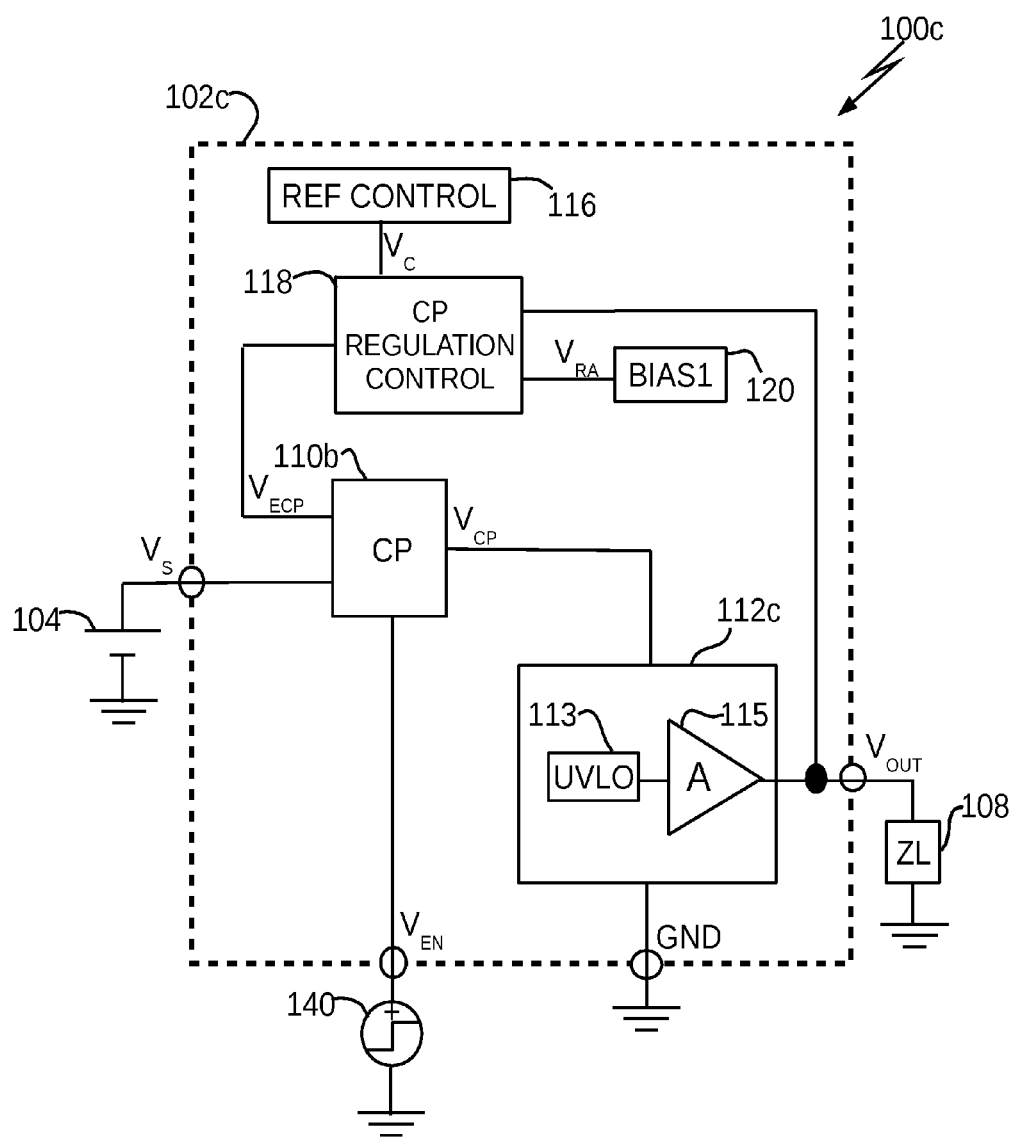
FIG. 1C is a schematic diagram of a low voltage system using a regulated charge pump system according to another embodiment.

FIG. 1C is a schematic diagram of a low voltage system 100c using a regulated charge pump system 102c according to another embodiment. The regulated charge pump system 102c is similar to the regulated charge pump system 102b of FIG. 1B, except in FIG. 2C a circuit subsystem 112c is shown to include an undervoltage lockout (UVLO) circuit 113 and a stage 115 providing the output voltage $V_{OUT}$. The circuit subsystem 112c can be similar to the circuit subsystem 112 of FIG. 2A and FIG. 2B, except the UVLO circuit 113 can be used to control the stage 115 and the circuit subsystem 112c to remain in an off state until the charge pump voltage $V_{CP}$ exceeds a threshold level. In this way the output voltage $V_{OUT}$ provided at an output of the stage 115 can be held at a low or at a known voltage level until the charge pump voltage reaches a suitable level for driving the circuit subsystem 112c. Here the term "driving" means to supply energy to the circuit subsystem 112c; and as one of ordinary skill in the art can appreciate, the UVLO circuit 113 can enhance the transient behavior of the charge pump 110b by reducing transient loading effects of the circuit subsystem 112c on the charge pump 110b.

Figure 1D:
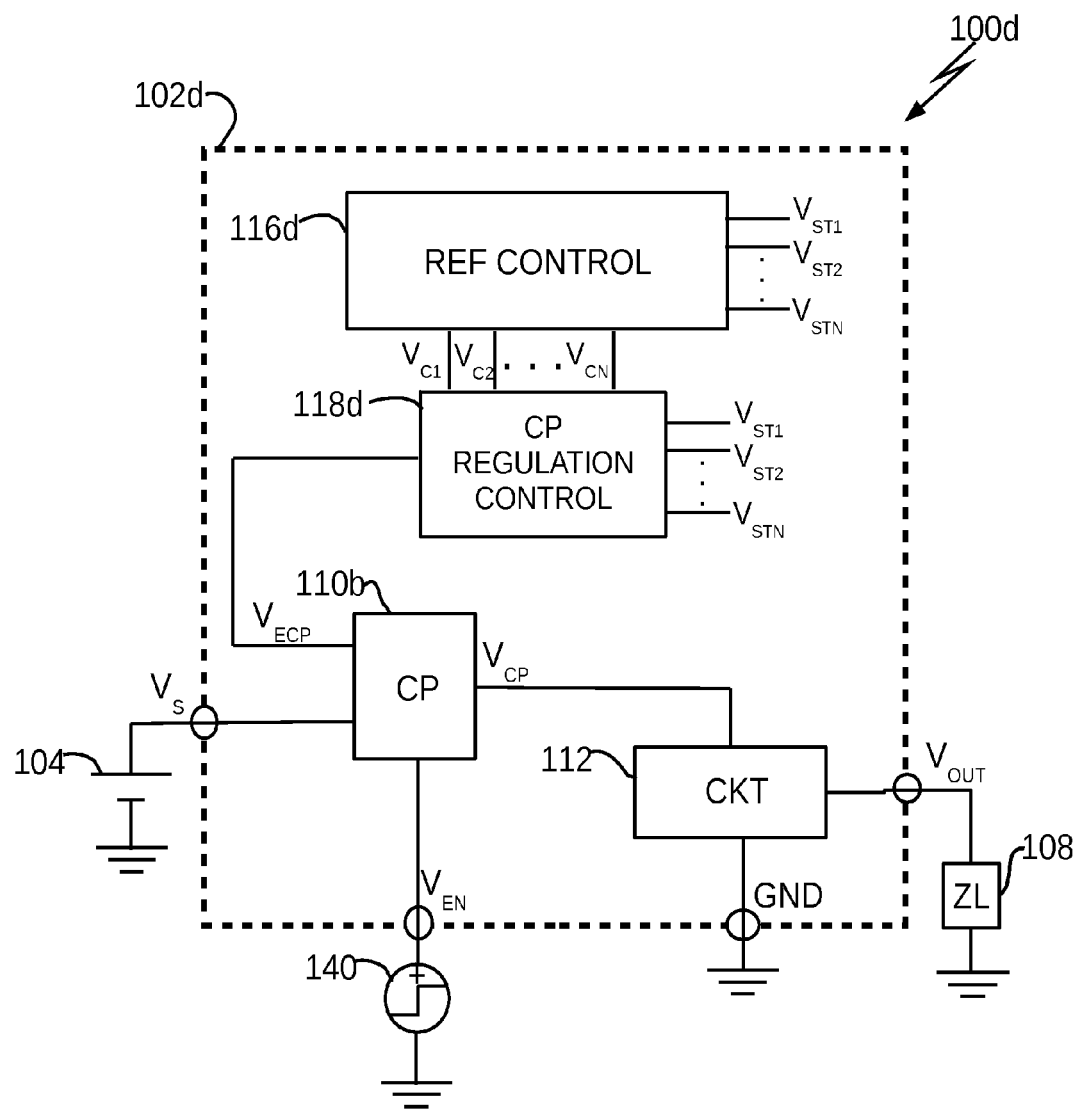
FIG. 1D is a schematic diagram of a low voltage system using a regulated charge pump system according to another embodiment.

FIG. 1D is a schematic diagram of a low voltage system 100d using a regulated charge pump system 102d according to another embodiment. The regulated charge pump system 102d is similar to the regulated charge pump system 102b of FIG. 1B; except as shown in FIG. 2D, the regulated charge pump system 102d includes a reference control module 116d and a charge pump regulation control module 118d. Unlike the reference control module 116, the reference control module 116d receives a plurality of state signals $V_{ST1} \ldots V_{STN}$ representing signals, including voltages, of the regulated charge pump system 102d. For instance, the plurality of state signals $V_{ST1} \ldots V_{STN}$ can include the output voltage $V_{OUT}$, auxiliary bias voltages, and voltages from other nodes of the circuit subsystem 112. During the transient and steady states, a plurality of control signals $V_{C1} \ldots V_{CN}$ can control the charge pump regulation control module 118d to provide the signal $V_{ECP}$ based upon a state dependent reference. For instance, during the transient state, the reference control module 116d can provide the plurality of control signal $V_{C1} \ldots V_{CN}$ to the charge pump regulation control module 118d so that the charge pump regulation control module 118 provides the signal $V_{ECP}$ based upon one or more of the plurality of state signals $V_{ST1} \ldots V_{STN}$. Further, having the plurality of control signals $V_{C1} \ldots V_{CN}$ provides more than one degree of freedom such that there can be more than one transient state reference. For instance, the transient state reference can have piecewise linear values or have values which are a function of time during the transient state. During the steady state, the reference control module 116d can provide the plurality of control signals $V_{C1} \ldots V_{CN}$ to the charge pump regulation control module 118d so that the charge pump regulation control module 118d provides the signal $V_{ECP}$ based upon the output voltage $V_{OUT}$. In the steady state the steady state reference can be the output voltage $V_{OUT}$. Here, to be consistent with the plurality of signals (or vector) notation, the output voltage $V_{OUT}$ is one of the state signals $V_{ST1} \ldots V_{STN}$.

Figure 2A:
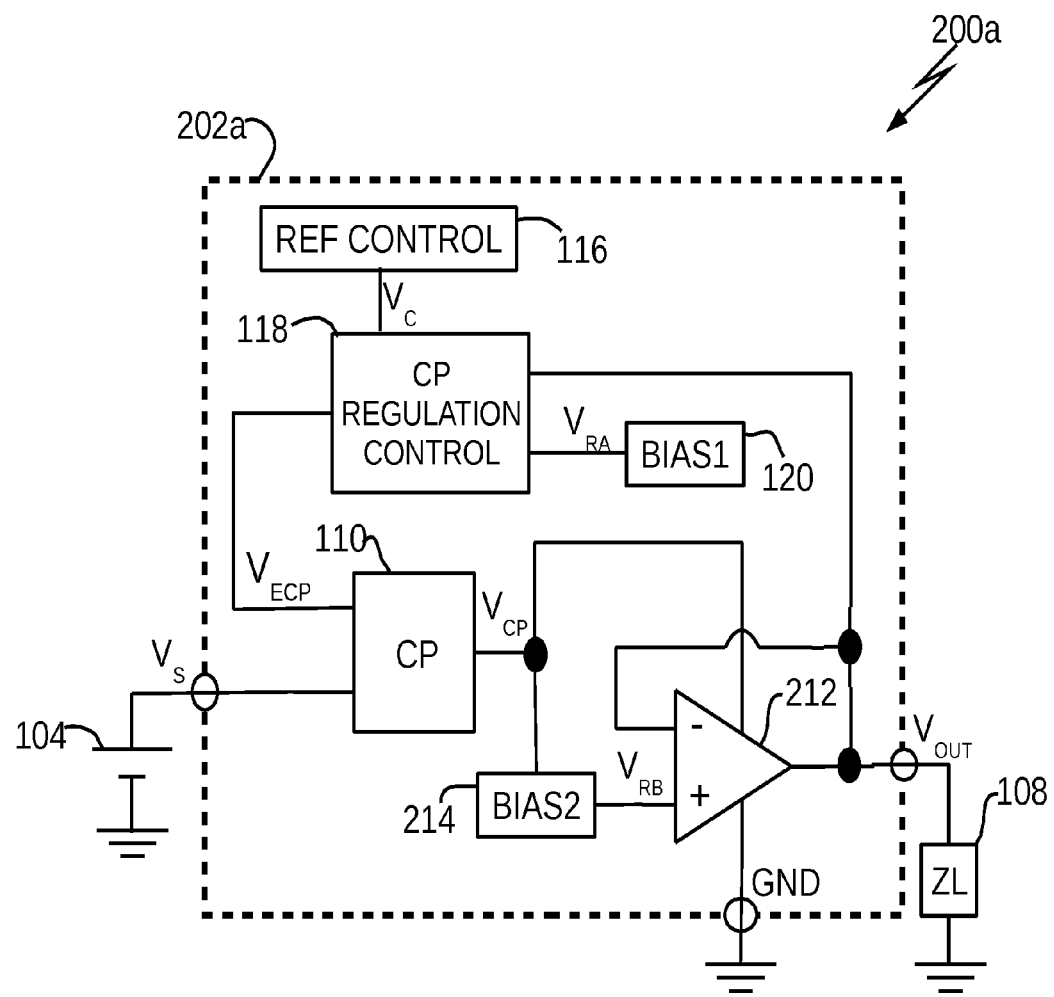
FIG. 2A is a schematic diagram of a low voltage system using a regulated charge pump system according to one embodiment.

FIG. 2A is a schematic diagram of a low voltage system 200a using a regulated charge pump system 202a according to one embodiment. The low voltage system 200a is similar to the low voltage system 100a of FIG. 1A except the low voltage system 200a includes a second bias circuit 214 and an amplifier 212 replacing the circuit subsystem 112 of FIG. 1A. The amplifier 212 has a ground port connected to ground GND, a subsystem supply node connected to the output port of the charge pump 110, and an inverting terminal and an output port electrically connected together. The second bias circuit 214 has an output connected to a noninverting input of the amplifier 212 so as to provide a second reference voltage $V_{RB}$ to the noninverting input. The second bias circuit 214 also has a subsystem supply node connected to the output port of the charge pump 110. As can be seen in FIG. 2A, the charge pump 110 can provide the charge pump voltage $V_{CP}$ to the subcircuit supply node of the second bias circuit 214 and the amplifier 212. The second bias circuit 214 and the amplifier 212 can be circuits or subcircuits which normally cannot operate from supply voltages less than one volt. The charge pump 110 can advantageously convert the supply voltage $V_S$ at the supply node of the low voltage system 200a to a higher voltage suitable for operating the second bias circuit 214 and the amplifier 212.

As one of ordinary skill in the art can recognize, the second bias circuit 214 and the amplifier 212 are configured to operate as a unity gain buffer providing an output voltage $V_{OUT}$ equal to the second reference voltage $V_{RB}$. The second bias circuit 214 and the amplifier 212 can operate as a circuit subsystem of the regulated charge pump system 202a and provide the output voltage $V_{OUT}$.

Figure 2B:
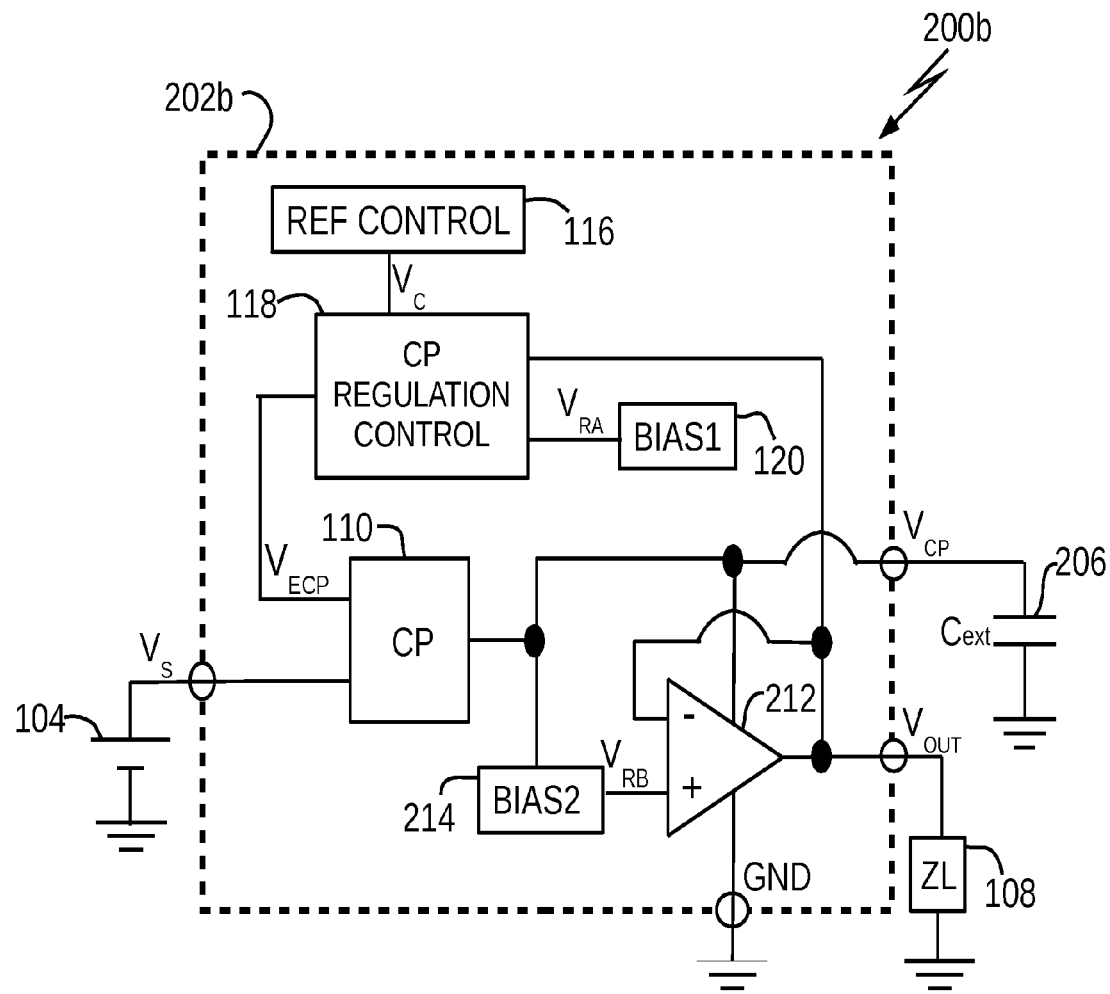
FIG. 2B is a schematic diagram of a low voltage system using a regulated charge pump system according to another embodiment.

FIG. 2B is a schematic diagram of a low voltage system 200b using a regulated charge pump system 202b according to another embodiment. The low voltage system 200b is similar to the low voltage system 200a except an output filter capacitor 206 is connected to a charge pump output node of the low voltage system 200b. As shown in FIG. 2B, the charge pump output node is connected to the charge pump output port of the charge pump 110. As one of ordinary skill in the art can appreciate, the output filter capacitor 206 can advantageously improve a ripple component of the charge pump voltage $V_{CP}$.

The second bias circuit 214 can provide the second reference signal $V_{RB}$ having a constant steady state value such as 1V. However, as one of ordinary skill in the art can appreciate, the second reference signal $V_{RB}$ can have time varying steady state value such as a steady state sinusoidal component. In turn, the output voltage $V_{OUT}$ can have a time varying steady state value. When the time varying component varies on a time scale longer than a time scale of the charge pump 110, then the charge pump can be regulated to the output voltage $V_{OUT}$ having a time varying component. In this way the charge pump voltage $V_{CP}$ will follow (track) the output voltage $V_{OUT}$ in response to steady state changes in the output voltage $V_{OUT}$. For instance, if the output filter capacitor has a value such that the charge pump voltage $V_{CP}$ responds relatively fast compared to periodic variations or changes in the output voltage $V_{OUT}$, then the charge pump voltage $V_{CP}$ can follow (track) the output voltage.

On the other hand, when the time varying component varies on a time scale much shorter than a time scale of the charge pump 110, then the charge pump can be regulated to a time averaged value of the output voltage $V_{OUT}$ by virtue of a time constant filtering effect. For instance, if the output filter capacitor has a value such that the charge pump voltage $V_{CP}$ changes slowly compared to perturbations or changes in the output voltage $V_{OUT}$, then the charge pump voltage $V_{CP}$ can be regulated to an average steady state value of the output voltage $V_{OUT}$.

Figure 3:
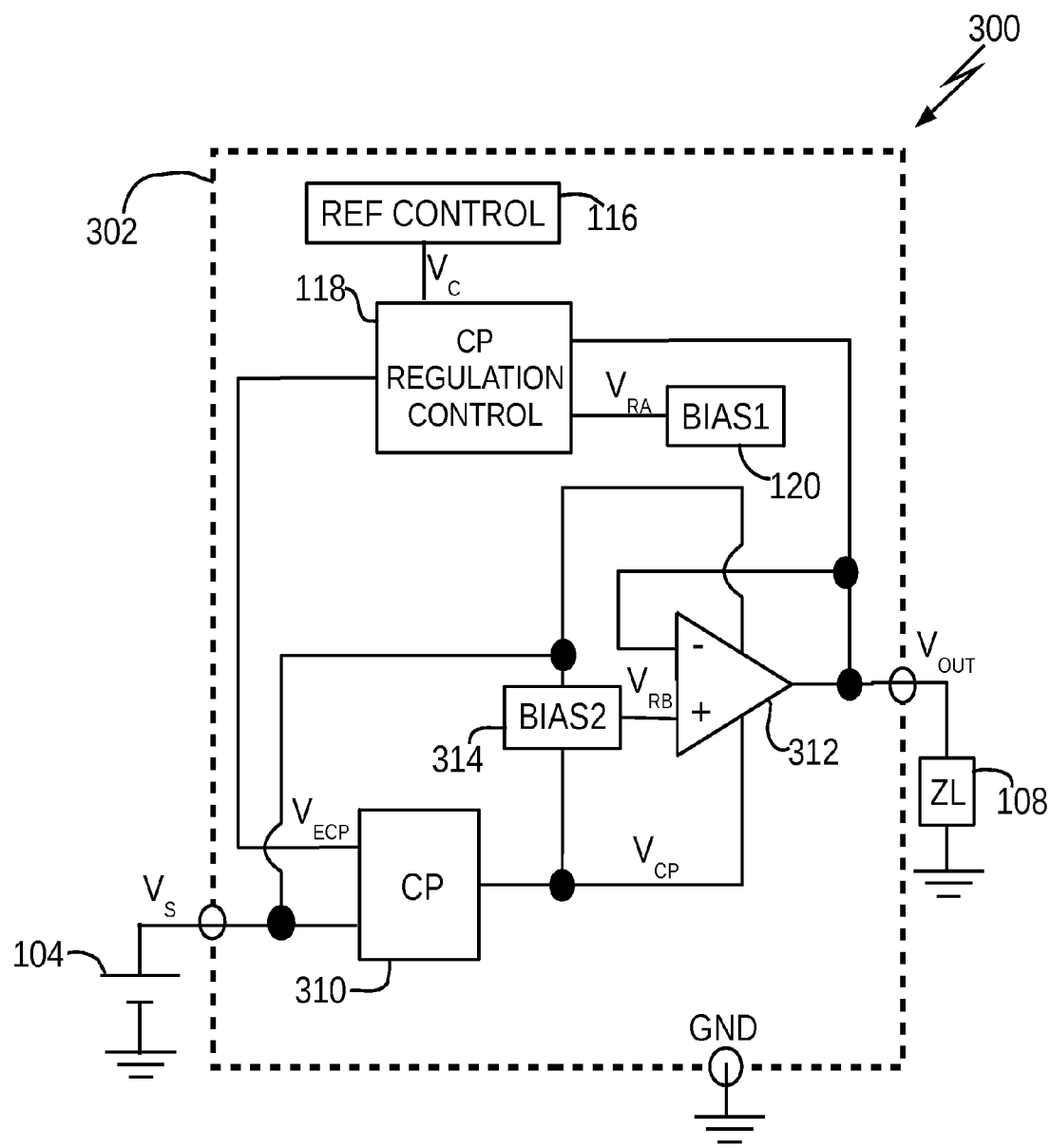
FIG. 3 is a schematic diagram of a low voltage system using a regulated charge pump system according to another embodiment.

FIG. 3 is a schematic diagram of a low voltage system 300 using a regulated charge pump system 302 according to another embodiment. From a system "black box" perspective the low voltage system 300 can perform the same function as the low voltage system 200a of FIG. 2A. For instance, like that of FIG. 2A, the low voltage system 300 has a ground port, a supply node, and an output port. The low voltage system 300 operates so as to receive a supply voltage $V_S$ which can have a voltage value less than one. Also, like that of FIG. 2A, it can further provide an output voltage $V_{OUT}$ equal to the second reference signal $V_{RB}$ at the output node.

However, unlike that of FIG. 2A, the low voltage system 300 has an amplifier 312 and a bias circuit 314 replacing the amplifier 212 and the second bias circuit 214 of FIG. 2A. Both the bias circuit 314 and the amplifier 312 have a positive subsystem supply node connected to the supply node of the low voltage system 200a; both also have a subsystem supply node, which can also be referred to as a negative subsystem supply node, connected to the charge pump output port of a charge pump 310. The low voltage system 300 uses the charge pump 310 to provide a negative charge pump voltage $V_{CP}$ to the subsystem supply node of the bias circuit 314 and to the subsystem supply node of the amplifier 312. As one of ordinary skill in the art can recognize, the remaining connections of the amplifier 312 and the bias circuit 314 configure the amplifier 312 to operate as a unity gain buffer providing an output voltage $V_{OUT}$ equal to the second reference voltage $V_{RB}$.

The negative charge pump voltage $V_{CP}$ with the supply voltage $V_S$ can operate as split supplies providing sufficient supply voltage for the bias circuit 314 and the amplifier 312 to operate as a unity gain buffer. Further, like the low voltage system 202a of FIG. 2A, the low voltage system 302 can operate in the steady state such that the output voltage $V_{OUT}$ is the steady state reference value; in this way the negative charge pump voltage $V_{CP}$ is regulated with respect to the output voltage $V_{OUT}$. Like the control signal $V_{ECP}$ of the low voltage system 202a, the control signal $V_{ECP}$ of the low voltage system 300 can be a digital control signal which regulates the charge pump voltage $V_{CP}$ by controlling an enable condition of a charge pump oscillator. Those of ordinary skill in the art can recognize how a digital signal can be used to regulate a charge pump voltage, either negative or positive, by enabling and disabling an oscillator of a charge pump.

Figure 4A:
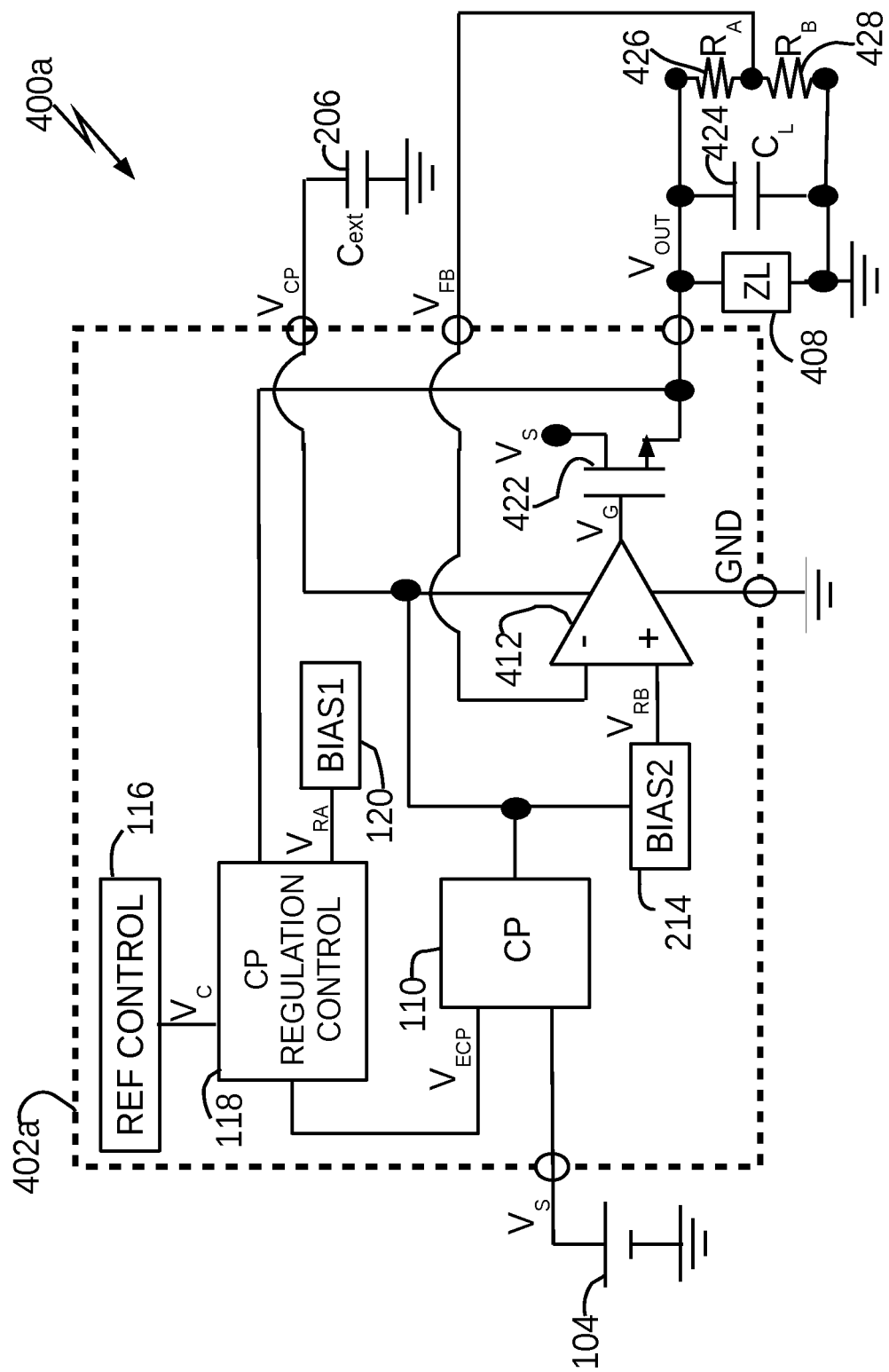
FIG. 4A is a schematic diagram of a low voltage linear regulator system using a regulated charge pump system according to an embodiment.

FIG. 4A is a schematic diagram of a low voltage linear regulator system 400a using a regulated charge pump system 402a according to an embodiment. The low voltage linear regulator system 400a is similar to the low voltage system 200b of FIG. 2B; however, the linear regulator system 400a replaces the load 108 with a load 408 connected in parallel with a load capacitor 424 and a feedback divider formed by a series connected resistor 426 and a series connected resistor 428. The regulated charge pump system 402a also differs from the regulated charge pump system 202b of FIG. 2B in that it replaces the amplifier 212 with an amplifier 412; and the regulated charge pump system 402a further includes an N-channel FET (NMOS) pass device 422. The NMOS pass device 422 has a drain connected to a supply node of the low voltage system 402 so as to receive the supply voltage $V_S$. The NMOS pass device 422 further has a gate electrically connected to an output port of the amplifier 412 so as to receive a gate control voltage $V_G$ from the amplifier 412. Additionally, the NMOS pass device 422 has a source connected to an output port of the regulated charge pump system 402a so as to provide an output voltage $V_{OUT}$. An inverting input of the amplifier 412 is connected to a feedback port of the regulated charge pump system 402a so as to receive a feedback voltage $V_{FB}$. A noninverting input of the amplifier 412 is connected to the second bias reference 214 so as to receive the second reference signal $V_{RB}$. As one of ordinary skill in the art can recognize, a feedback node of the feedback divider formed by the series connected resistors 426 and 428 provides the feedback voltage $V_{FB}$ as a sample of the output voltage $V_{OUT}$.

Also as one of ordinary skill in the art can appreciate, when the second reference signal $V_{RB}$ is a stable voltage reference such as a bandgap reference, then the circuit subsystem can operate as a linear regulator providing a stable output voltage $V_{OUT}$. The linear regulator can have a transient state and a steady state, also referred to as a subcircuit transient state and a subcircuit steady state, where in the steady state the output voltage $V_{OUT}$ has a steady state value. The reference control module 116 with the charge pump control module 118 can regulate the charge pump 110 to provide a charge pump voltage $V_{CP}$ which is regulated with respect to a state dependent reference. During the transient state, the state dependent reference can have a transient state reference value equal to the supply voltage $V_S$ or to a fraction of the supply voltage. During the steady state, the state dependent reference can have a steady state reference value equal to the output voltage $V_{OUT}$ or equal to a fraction of the output voltage $V_{OUT}$.

When the charge pump voltage $V_{CP}$ is regulated to the output voltage $V_{OUT}$, a gate to source voltage of the NMOS pass device 422 can advantageously be controlled or limited to a value which depends upon the output voltage $V_{OUT}$. Compared to using a fixed reference, such as a bandgap voltage as a steady state reference value, using the output voltage as the steady state reference value limits the gate to source voltage to a smaller voltage. Those of ordinary skill in the art can recognize from FIG. 4A that the a maximum value of $V_G$ can equal the charge pump voltage $V_{CP}$; therefore, regulating or limiting the charge pump voltage as a function of $V_{OUT}$ can advantageously limit a maximum gate-to-source voltage of the NMOS pass device 422.

Also, as one of ordinary skill in the art can further appreciate, a linear regulator can provide a steady state output voltage which has time varying perturbations due to changes in the load 408. As discussed with respect to the regulated charge pump system 202b, when a time varying component of the output voltage $V_{OUT}$ varies on a time scale much shorter than a time scale of the charge pump 110, then the charge pump voltage $V_{CP}$ be regulated to a time averaged value of the output voltage $V_{OUT}$ by virtue of a time constant filtering effect.

Although FIG. 4A shows the regulated charge pump system 402a as having the second bias reference 214, the NMOS pass device 422, and the amplifier 412, a linear regulator system can have additional circuit subsystem components including but not limited to thermal shutdown circuits, overcurrent circuits, and undervoltage lockout (UVLO) circuits. Also, as one of ordinary skill in the art can appreciate, the amplifier 412 can have additional circuit functions including soft start and can be an amplifier topology such as folded cascode amplifier with class AB buffering.

Figure 4B:
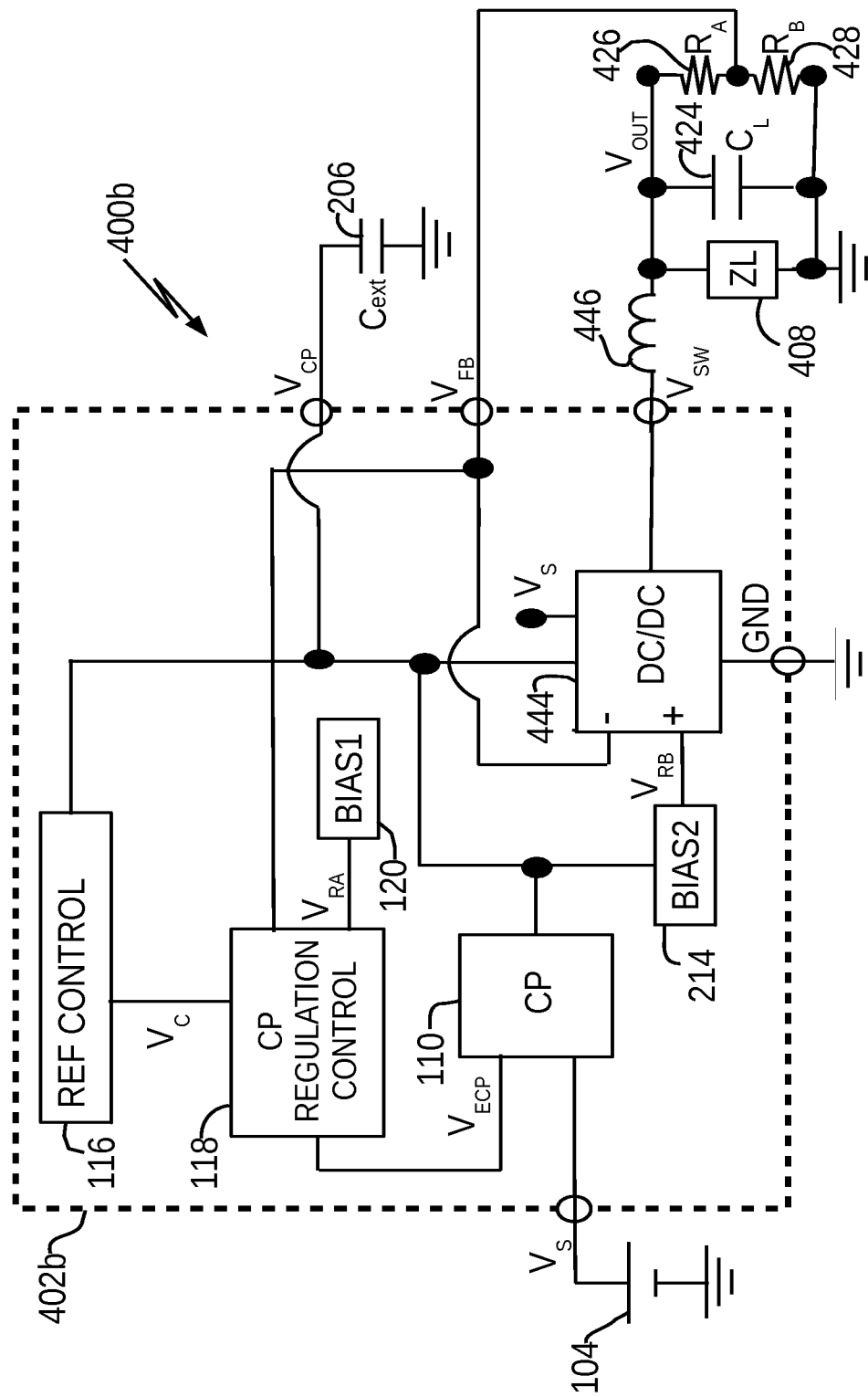
FIG. 4B is a schematic diagram of a low voltage switching regulator system using a regulated charge pump system according to an embodiment.

FIG. 4B is a schematic diagram of a low voltage switching regulator system 400b using a regulated charge pump system 402b according to an embodiment. The low voltage switching regulator system 400b is similar to the low voltage switching regulator system 400a except the system includes an inductor 446 as a switching regulator component. Compared to the regulated charge pump system 402a of FIG. 4A, the regulated charge pump system 402b replaces the output port with a switch node port providing a switching voltage $V_{SW}$ to a first node of the inductor 446. The second node of the inductor is connected to the output node providing the output voltage $V_{OUT}$. Also, the load 408, the load capacitor 424, and the feedback network having the series connected resistor 426 and the series connected resistor 428 are connected in parallel between the output node and the ground node.

Also, unlike the regulated charge pump system 402a, the regulated charge pump system 402b replaces the output node connection to the charge pump regulation control module 118 with the feedback node connection. In this way the charge pump regulation control module receives the feedback voltage $V_{FB}$ to replace the output voltage $V_{OUT}$ as the steady state reference value. As one of ordinary skill in the art can appreciate, in the regulated charge pump system 402b, the feedback voltage $V_{FB}$ can provide a sample of the output voltage $V_{OUT}$.

The regulated charge pump system 402b replaces the amplifier 412 and the NMOS pass device 422 with a switch mode regulator circuit subsystem 444, also referred to as a DC-to-DC regulator. The switch mode regulator circuit subsystem 444 receives the charge pump voltage $V_{CP}$ at a subsystem supply node and also receives the supply voltage $V_S$ at an input node so as to provide the switching voltage $V_{SW}$ with a controlled duty cycle and a maximum pedestal voltage equal to the supply voltage $V_S$. In the embodiment of FIG. 4B, the low voltage switching regulator system 400b is configured as a buck, step-down, regulator system. However, as one of ordinary skill in the art can appreciate, other regulator systems, such as boost systems, are possible.

Figure 5:
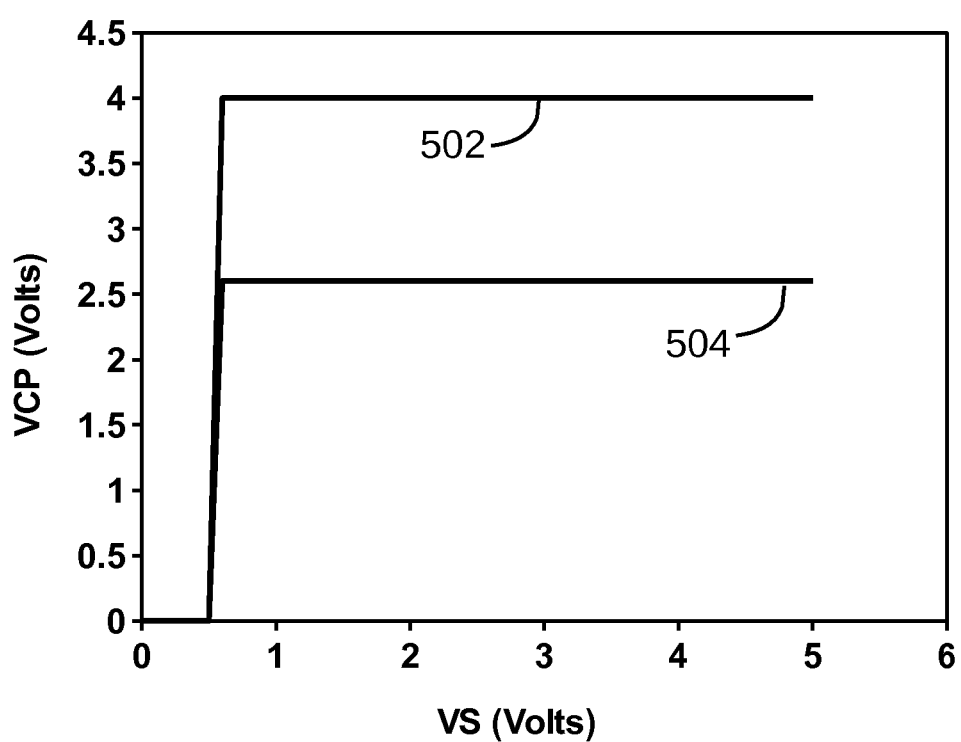
FIG. 5 is a graph of charge pump voltage versus supply voltage according to one embodiment.

FIG. 5 is a graph of charge pump voltage $V_{CP}$ versus supply voltage $V_S$ according to one embodiment. The graph shows a first plot 502 and a second plot 504 of a regulated charge pump voltage $V_{CP}$ of a system such as the regulated charge pump system 402a of FIG. 4A. Both the first plot 502 and the second plot 504 can represent the charge pump voltage $V_{CP}$ when the regulated charge pump system 402a operates in the steady state. As discussed with respect to the embodiment of FIG. 4A, the steady state charge pump output voltage $V_{CP}$ can be regulated with respect to the steady state output voltage $V_{OUT}$. Further, the first plot 502 can represent the charge pump output voltage $V_{CP}$ when the output voltage equals a first value, say 0.5V; while the second plot 504 can represent the charge pump output voltage $V_{CP}$ when the output voltage equals a second value, say 2.0V.

Also as can be seen in FIG. 5, both the first and second plots 502 and 504 show a constant charge pump voltage $V_{CP}$ as a function of the supply voltage $V_S$ when the supply voltage $V_S$ is greater than about 0.6V. However, when the supply voltage $V_S$ is less than about 0.5V, the first and second plots 502 and 504 show the charge pump voltage is 0V. This can indicate that the system, such as the regulated charge pump system 402a, was configured for a supply voltage of about 0.6V. However, as one of ordinary skill in the art can appreciate, other minimum values and operating conditions can be possible; and the embodiment of FIG. 5 is not limiting.

Figure 6:
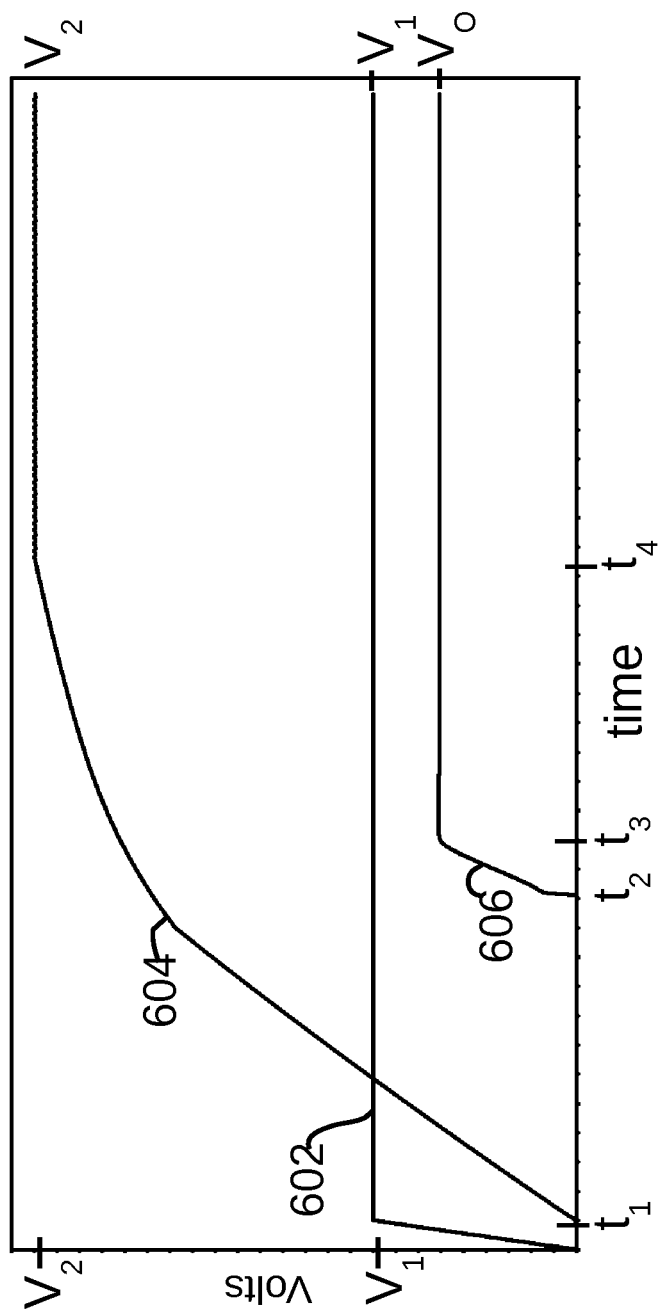
FIG. 6 is a graph of a charge pump voltage waveform, a supply voltage waveform, and an output voltage waveform according to one embodiment.

FIG. 6 is a graph of a charge pump voltage waveform 604 of a charge pump voltage $V_{CP}$, a supply voltage waveform 602 of a supply voltage $V_S$, and an output voltage waveform 606 of an output voltage $V_{OUT}$ according to one embodiment. The graph shows the supply voltage $V_S$ reaches its maximum value $V_1$ at time $t_1$ delineating the beginning of a transient state of a regulated charge pump system. Further, the charge pump voltage waveform 604, the supply voltage waveform 602, and output voltage waveform 606 can apply to the regulated charge pump system 402a of FIG. 4A, or alternatively, to the regulated charge pump systems 102a-d of FIGS. 1A-1D.

With reference to the regulated charge pump system 402a of FIG. 4A, at time $t_1$ the charge pump 110 operates in a transient state. The reference control module 116 can provide the control signal $V_C$ indicating that the output voltage $V_{OUT}$ has not reached its steady state value. For instance, as shown in FIG. 6, at time $t_1$ the output voltage waveform 606 is zero. The control signal $V_C$ from the reference control module 116 can control the charge pump regulation control module 118 to use a transient state reference, such as the voltage $V_{RA}$, having a non-zero value. In turn the charge pump 110 will operate to cause the charge pump voltage $V_{CP}$ to increase. If the charge pump voltage $V_{CP}$ exceeds a value limited by the transient state reference, then the control signal $V_{ECP}$ can change state to disable or regulate the charge pump voltage with respect to the transient state reference. In the example of FIG. 6, the regulated charge pump system 402a is configured such that the charge pump voltage $V_{CP}$ increases monotonically and is not limited during the transient state. However, as one of ordinary skill in the art can recognize, the charge pump voltage $V_{CP}$ can follow a different transient waveform, unlike the charge pump voltage waveform 604, based upon the circuit configuration. For instance, the transient rate of change of the charge pump voltage $V_{CP}$ can depend upon the capacitance of the output filter capacitor 206.

Also with reference to the regulated charge pump system 102c of FIG. 1C, the circuit subsystem 112c can include the UVLO circuit 113. At a time $t_2$ the UVLO circuit 113 can detect the charge pump voltage $V_{CP}$ level compared to a threshold level. The time $t_2$ can correspond to when the UVLO circuit 113 enables the circuit subsystem 112c and allows the output voltage waveform 606 to increase to its steady state value of $V_O$ at time $t_3$. At time $t_3$ the circuit subsystem 112c provides a stable steady state output voltage $V_{OUT}$ equal to $V_O$. Also at time $t_3$, the reference control module 116 can provide the control signal $V_C$ to the charge pump regulation control module 118 to indicate the circuit subsystem 112c has reached a subcircuit steady state. At this point the charge pump regulation control module can use the stable output voltage $V_{OUT}$ as the steady state reference. The charge pump waveform continues to rise until it reaches its steady state value $V_2$ at time $t_4$. At time $t_4$ the control signal $V_{ECP}$ regulates the charge pump voltage to equal $V_2$ using the output voltage $V_{OUT}$ as the steady state reference. Also, the charge pump waveform 604 reaches the steady state at time $t_4$ where it is regulated to a voltage value $V_2$ determined by the steady state reference value $V_O$.

Although the output voltage waveform 606 corresponds to an embodiment where the output voltage value $V_O$ is constant, other steady state conditions are possible. For instance, as discussed with respect to the embodiment of FIG. 2B, the output voltage $V_{OUT}$ can also reach a steady state having an output voltage $V_{OUT}$ with a time varying component.

Figure 7:
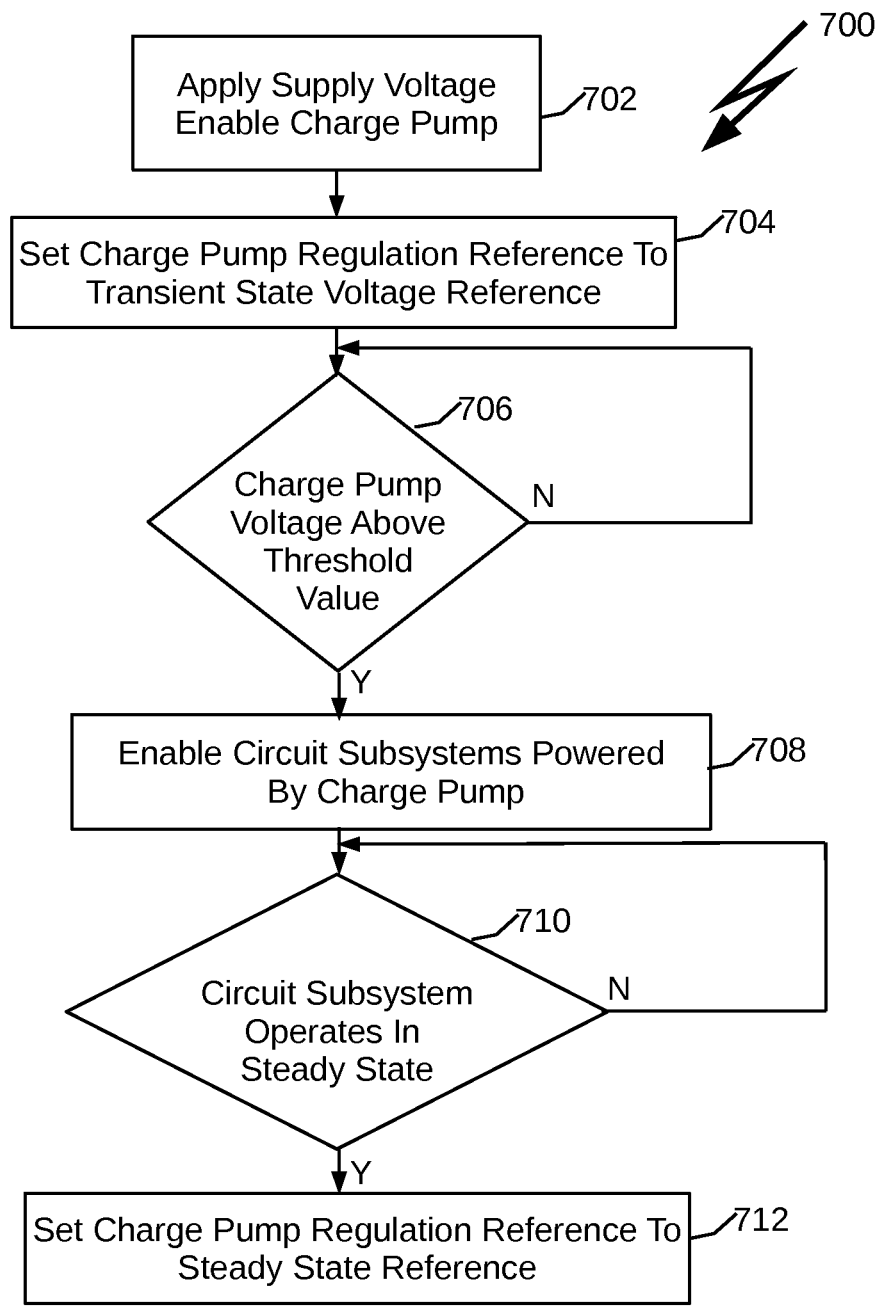
FIG. 7 is a flow diagram of a regulated charge pump system according to one embodiment.

FIG. 7 is a flow diagram 700 of a regulated charge pump system according to one embodiment. The flow diagram 700 begins with an operation 702. The operation 702 corresponds to applying a supply voltage $V_S$ to a regulated charge pump system and to enabling a charge pump. Referring to the low voltage systems 100a-d of FIGS. 1A-1D and to the graph of FIG. 6, this can correspond to applying the supply voltage $V_S$ and enabling the charge pump 110 at time $t_1$. The charge pump 110 can be enabled with the enable signal $V_{EN}$ as in FIG. 1B or without an enable signal as in FIG. 1A. In FIG. 1A the charge pump 110 can be enabled by the action of applying the supply voltage $V_S$.

An operation 704 corresponds to using a transient state reference value. This can include when the reference control module 116 provides a control signal $V_C$ to the charge pump regulation control module 118 to cause the charge pump regulation control module 118 to use the transient state reference. With reference to FIG. 7, this operation can also correspond to time greater than $t_1$. As the charge pump voltage $V_{CP}$ increases as shown by the charge pump waveform 604, a decision step 706 can be functionally performed by a circuit subsystem block such as the UVLO circuit 113 of FIG. 1C. With reference to the output voltage waveform 606 of FIG. 6, the decision step 706 indicates a true condition at time $t_2$ where the charge pump voltage $V_{CP}$ is greater than a threshold level.

The next step following the true condition is an operation 708 corresponding to enabling the circuit subsystem 112. Referring again to FIG. 6, once the circuit subsystem is enabled at time $t_2$, the output voltage $V_{OUT}$ can transition to a steady state value $V_O$ at time $t_3$. A decision step 710 can correspond to a decision process during a subsystem transient time from $t_2$ to $t_3$. During this period the reference control module 116 can monitor the output voltage $V_{OUT}$ Referring to FIG. 6, the decision step 710 can become a logical true condition at time $t_3$ at which time the output voltage waveform 606 reaches its steady state value $V_O$. As shown in FIG. 7, this leads to an operation 712 which corresponds to using the steady state reference value. The reference control module 116 now provides a control signal $V_C$ to the charge pump regulation control module 118 to cause the charge pump regulation control module 118 to use the steady state reference. The steady state reference can be the output voltage $V_{OUT}$ or a function of the circuit subsystem output voltage $V_{OUT}$.

Figure 8:
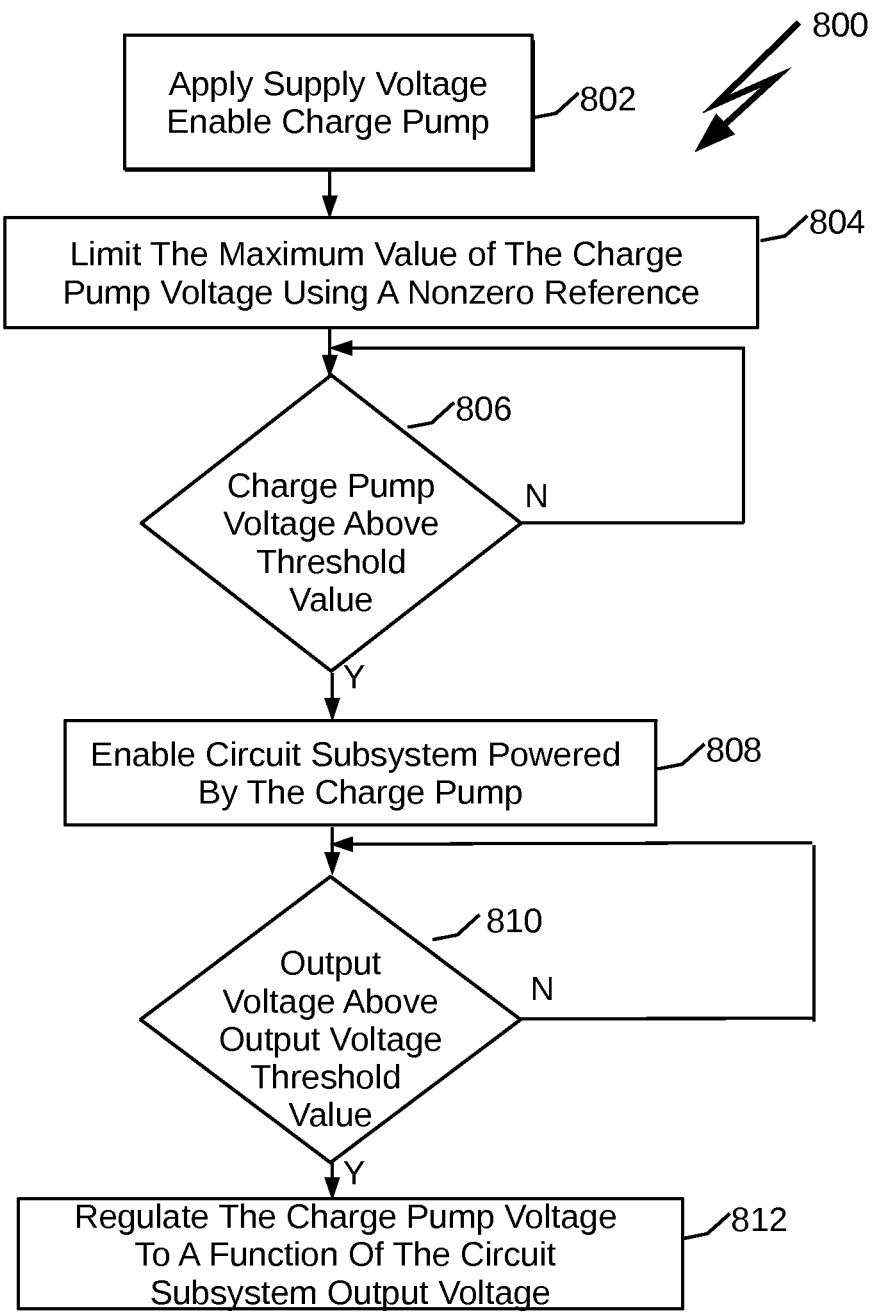
FIG. 8 is a flow diagram of a regulated charge pump system according to one embodiment.

FIG. 8 is a flow diagram 800 of a regulated charge pump system according to one embodiment. The flow diagram 800 is similar to the flow diagram 700 of FIG. 7, except the description of decision and operation steps are presented with a higher level mathematical perspective. An operation 802 corresponding to enabling the charge pump can be equivalent to operation 702 of FIG. 7. An operation 804 can be equivalent to that of the decision step 704 except from a mathematical perspective the operation 804 indicates limiting the maximum value of the charge pump voltage using a nonzero reference. This can be equivalent to when the reference control module 116 of FIG. 1A controls the charge pump regulation control module 118 to use the transient state reference. The charge pump voltage $V_{CP}$ is controlled such that if it exceeds a level determined by the transient state reference value, then it is limited through the charge pump regulation control module 118. However, it is possible for it to remain below the level or limit determined by the transient state reference as discussed with respect to the charge pump waveform 604 of FIG. 6. Operation 804, referring to using a nonzero reference, can also imply allowing the charge pump to rise in an open loop manner with a maximum limit set by the transient reference value.

A decision step 806 and an operation 808 are functionally equivalent to that of the decision step 706 and operation 708 of FIG. 7, respectively. A decision step 810 is similar to that of the decision of FIG. 7, except the decision step 810 is written to indicate a criterion for the circuit subsystem 112 to reach steady state is based upon comparing the output voltage $V_{OUT}$ to a threshold value. As one of ordinary skill in the art can appreciate, the decision step 810 can be realized using circuit or subcircuit blocks such as comparators and reference voltages. Once the output voltage $V_{OUT}$ is determined to be above a threshold value, then the next step is an operation 812 which is similar to that of the operation 712 of FIG. 7, except the decision block 812 indicates regulating the charge pump voltage $V_{CP}$ to a function of $V_{OUT}$.

Figure 9A:
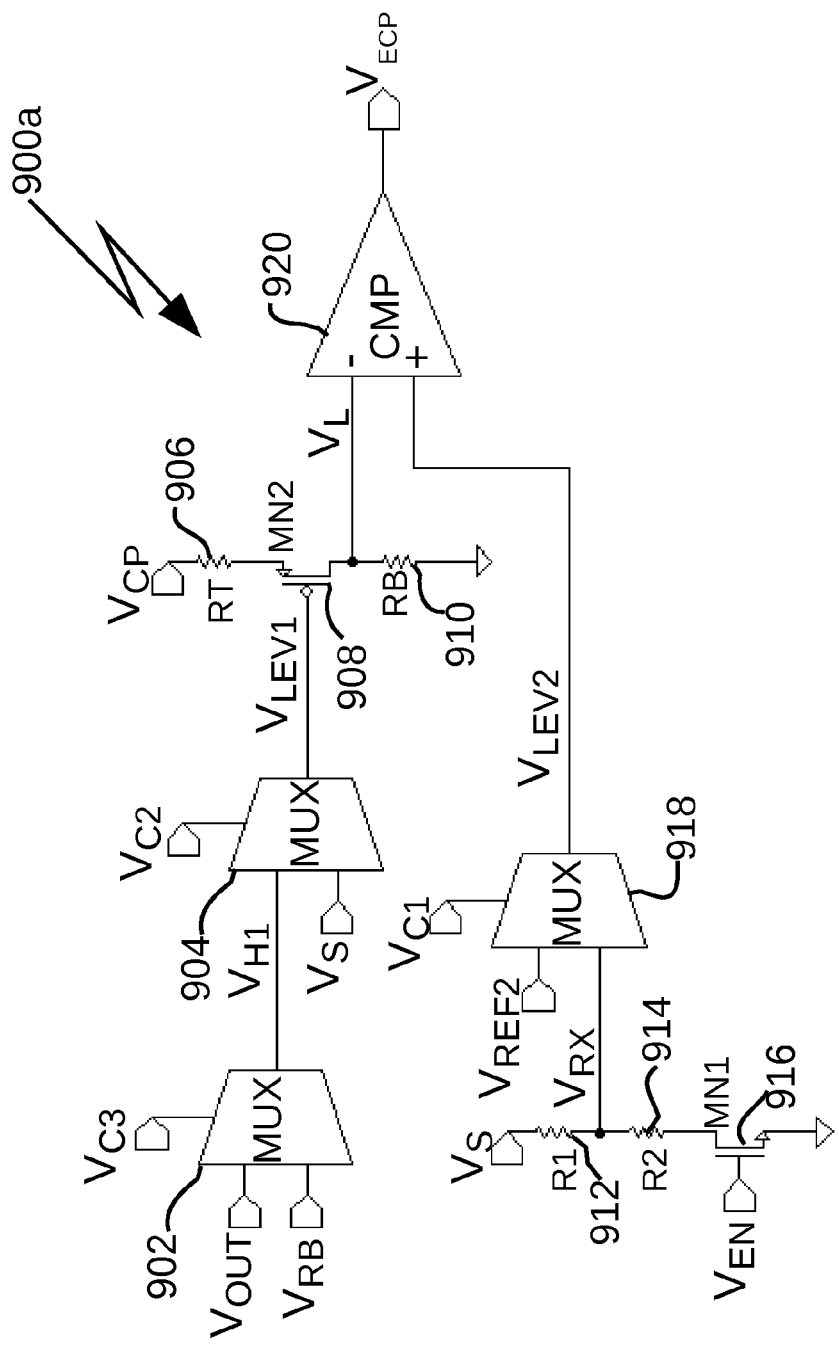
FIG. 9A is a circuit diagram of a charge pump regulation control module according to one embodiment.

FIG. 9A is a circuit diagram of a charge pump regulation control module 900a according to one embodiment. The charge pump regulation control module 900a can represent a more detailed circuit embodiment of a charge pump regulation control module such as the charge pump regulation control module 118 of FIG. 4A or the charge pump regulation control module 118d of FIG. 1D. The charge pump regulation control module 900a includes a multiplexer (MUX) 902, a MUX 904, a MUX 918, a resistor 906 of resistance RT, a resistor 910 of resistance RB, a resistor 912 of resistance R1, a resistor 914 of resistance R2, an NMOS (n-type metal oxide semiconductor field effect transistor) 916, a PMOS (p-type metal oxide semiconductor field effect transistor) 908, and a comparator 920.

The MUX 902 receives a voltage $V_{OUT}$ at a first MUX input and a voltage $V_{RB}$ at a second MUX input and provides an output voltage $V_{H1}$ at the MUX output; a control voltage $V_{C3}$ can control the output voltage $V_{H1}$ to be equal to either the voltage $V_{OUT}$ or the voltage $V_{RB}$ depending on a logic state, high or low, of the control voltage $V_{C3}$. The MUX output of the MUX 902 is electrically connected to a first MUX input of the MUX 904.

The MUX 904 receives the voltage $V_{H1}$ at the first MUX input and a voltage $V_S$ at a second MUX input and provides an output voltage $V_{LEV1}$ at the MUX output; a control voltage $V_{C2}$ can control the output voltage $V_{LEV1}$ to be equal to either the voltage $V_{H1}$ or the voltage $V_S$ depending on a logic state, high or low, of the control voltage $V_{C2}$. The MUX output of the MUX 904 is electrically connected to a gate of the PMOS 908.

The MUX 918 receives the voltage $V_{REF2}$ at a first MUX input and a voltage $V_{RX}$ at a second MUX input and provides an output voltage $V_{LEV2}$ at the MUX output; the control voltage $V_{C1}$ can control the output voltage $V_{LEV2}$ to be equal to either the voltage $V_{REF2}$ or the voltage $V_{RX}$ depending on a logic state, high or low, of the control voltage $V_{C2}$. The MUX output of the MUX 918 is electrically connected to a noninverting terminal of the comparator 920.

The PMOS 908 with the resistors 906 and 910 form a functional circuit which provides a voltage $V_L$ to an inverting terminal of the comparator 920. The resistor 910 is electrically connected between ground and a drain of PMOS 908. The drain of PMOS 908 is also connected to the inverting terminal of comparator 920 where it provides the voltage $V_L$. The resistor 906 is electrically connected between a first voltage node receiving the voltage $V_{CP}$ and a source of the PMOS 908. A relationship can be derived for the voltage $V_L$ in terms of the charge pump voltage $V_{CP}$, the gate to source voltage $V_{GS}$ of the PMOS 908, the voltage $V_{LEV1}$, and the resistances RT and RB as shown in Equation 1.

$$V_L = \frac{RB}{RT} \times (V_{CP} - V_{GS} - V_{LEV1}) \tag{1}$$

The NMOS 916 with the resistors 912 and 914 form a functional circuit which provides the voltage $V_{RX}$ to the second input of the MUX 918. The NMOS 916 operates as a switch so that the voltage $V_{RX}$ equals the voltage $V_S$ or a fractional amount of the voltage $V_S$ depending on a logic state of a voltage $V_{EN}$, high or low. The fractional amount is further determined by a divider ratio calculated from the resistances R1 and R2. The NMOS 916 has a source electrically connected to ground, a gate which receives the voltage $V_{EN}$, and a drain electrically connected to a first node of the resistor 914. The second node of the resistor 914 is electrically connected to the second input of the MUX 918 where it provides the voltage $V_{RX}$. The resistor 912 is electrically connected between the second node of the resistor 914 and a second voltage node receiving the voltage $V_S$.

The comparator 920 provides the control signal $V_{ECP}$ at a comparator output node. Comparing the charge pump regulation control module 900a with the charge pump regulation control module 118d of FIG. 1D, one of ordinary skill in the art can relate the plurality of state signals $V_{ST1} \ldots V_{STN}$ and plurality of control signals $V_{C1} \ldots V_{CN}$ of FIG. 1D with those of FIG. 9A. A plurality of control signals is given by the control voltages $V_{C1}$, $V_{C2}$, and $V_{C3}$ of FIG. 9A. Also, a plurality of state signals is given by the voltage $V_{EN}$, the voltage $V_{OUT}$, the voltage $V_{RB}$, the voltage $V_S$, the voltage $V_{CP}$, and the voltage $V_{REF2}$. By further inspection, the voltage $V_{EN}$ can be the enable signal $V_{EN}$ as described with respect to FIG. 1B. The voltage $V_{OUT}$ can be the output voltage $V_{OUT}$ of a circuit subsystem such as that introduced in FIG. 1A. Similarly, the voltage $V_{RB}$ can be the second reference signal $V_{RB}$ such as introduced in FIG. 2A. The voltages $V_S$ and $V_{CP}$ can be the supply voltage $V_S$ and the charge pump voltage $V_{CP}$ as first introduced in FIG. 1. Finally, voltage $V_{REF2}$ can be an additional node voltage representing a state signal.

The comparator 920 can provide the signal $V_{ECP}$ to a charge pump such as the charge pump 110 so as to regulate the charge pump voltage $V_{CP}$. A further analysis shows that the charge pump voltage $V_{CP}$ can be regulated to a charge pump level $V_{CPreg}$ given by Equation 2.

$$V_{CPreg} = \frac{RT}{RB} \times V_{LEV2} + V_{LEV1} + V_{GS} \quad (2)$$

The control voltage $V_{C1}$ can be a logic state associated with a transient or steady state condition of a circuit subsystem. For instance, if the output voltage $V_{OUT}$ of the circuit subsystem is determined to be in a transient state such that the output voltage $V_{OUT}$ has not reached a steady state threshold, then the control voltage $V_{C1}$ can control the MUX 918 to select the voltage $V_{RX}$. The control voltage $V_{C2}$ can be a logic state associated with a transient state or steady state condition of a charge pump such as the charge pump 110. For instance, the control voltage $V_{C2}$ can be provided from a UVLO circuit such as the UVLO circuit 113 of FIG. 1C. If the UVLO circuit 113 indicates the charge pump voltage $V_{CP}$ is less than a UVLO threshold level, then the MUX 904 can be controlled to select the voltage $V_S$. Additionally, the control voltage $V_{C3}$ can be a logic state which compares the magnitude of the voltage $V_{RB}$ to the magnitude of the voltage $V_{OUT}$ so as to control the MUX 902 to select the maximum of the voltages $V_{RB}$ and $V_{OUT}$. In the case of a regulated charge pump system, such as the regulated charge pump system 402a of FIG. 4A, the maximum of the voltages $V_{RB}$ and $V_{OUT}$ can equal $V_{OUT}$ in the steady state.

As shown in the embodiment of FIG. 9A, the charge pump regulation control module 900a receives the plurality of steady state control signals $V_{C1}$, $V_{C1}$, and $V_{C3}$ and also receives the plurality of state signals. Because these can be a function of time, during the transient state the charge pump voltage $V_{CP}$ can be regulated with respect to more than one transient state reference value prior to reaching a steady state condition. Also, as discussed with respect to the graph of FIG. 6, during the transient state the meaning of "regulated with respect to a transient state reference", can mean that a maximum value of the transient charge pump voltage $V_{CP}$ is limited by a function of the transient state reference. Also, as discussed with respect to the graph of FIG. 6, a transient state reference can be provided to allow the charge pump system to provide a transient charge pump voltage $V_{CP}$ which is non-zero.

Upon reaching the steady state, the control signals $V_{C1}$, $V_{C1}$, and $V_{C3}$ can control the signal $V_{ECP}$ such that the charge pump voltage $V_{CP}$ is regulated to a value $V_{CPregss}$ as given by Equation 3. In Equation 3 the term max($V_{RB}$, $V_{OUT}$) indicates the maximum value of $V_{RB}$ and $V_{OUT}$.

$$V_{CPregss} = \frac{RT}{RB} \times V_{REF2} + \max(V_{RB}, V_{OUT}) + V_{GS} \quad (3)$$

In the case of the regulated charge pump system of FIG. 4A, the maximum of the voltages $V_{RB}$ and $V_{OUT}$ equals $V_{OUT}$ and Equation 3 can be recast into Equation 4. Equation 4 shows that when the voltages $V_{REF2}$ and $V_{GS}$ are constant, the charge pump voltage $V_{CP}$ can be regulated to a value determined by the output voltage $V_{OUT}$ in the steady state.

$$V_{CPregss} = \frac{RT}{RB} \times V_{REF2} + V_{OUT} + V_{GS} \quad (4)$$

Although the embodiment of FIG. 9A shows the charge pump regulation control module 900a to have three multiplexers, three control voltages, and six state signals, other configurations having greater or fewer permutations of multiplexers, control voltages, and/or state signals are possible.

Figure 9B:
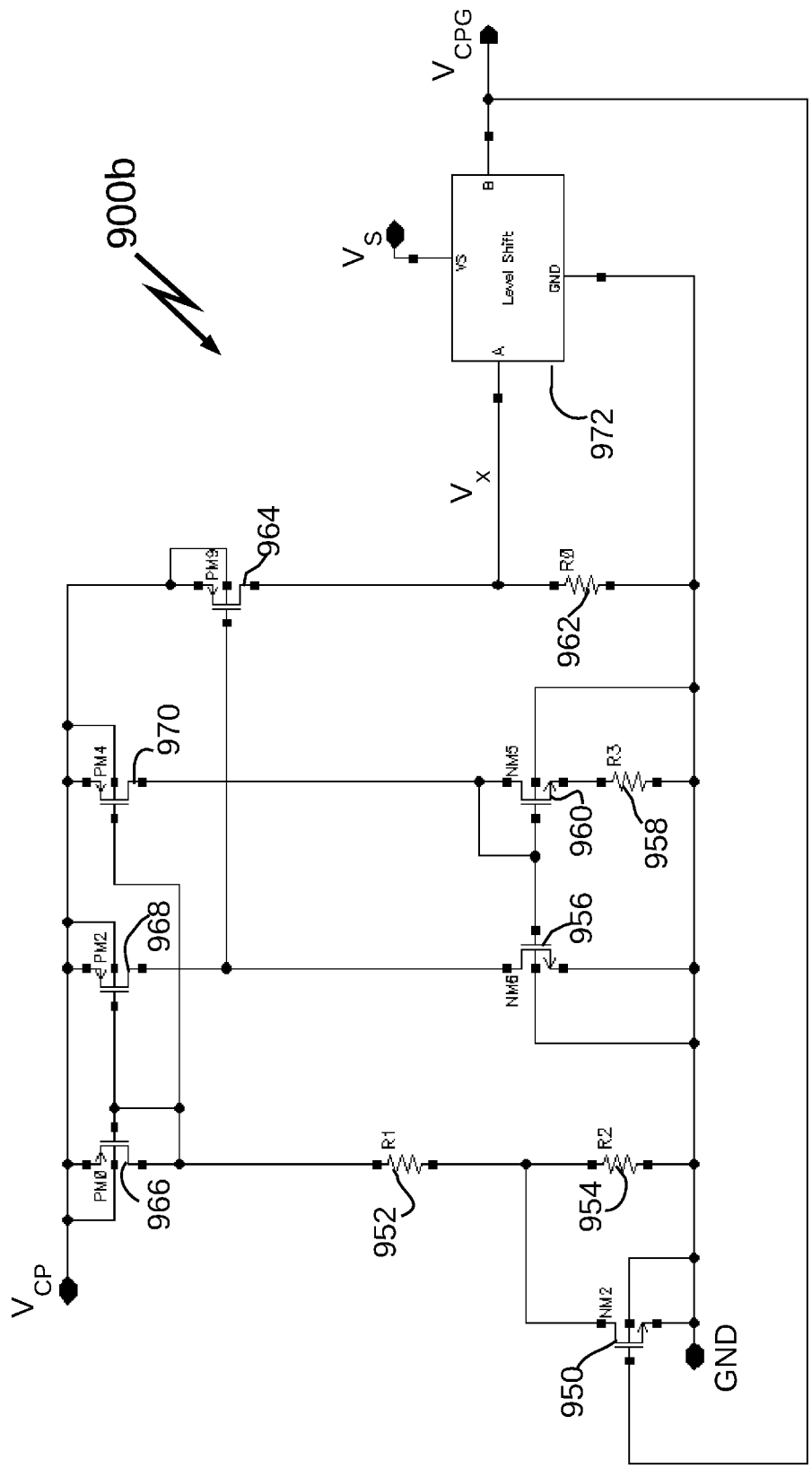
FIG. 9B is a circuit diagram of an undervoltage lockout (UVLO) circuit according to one embodiment.

FIG. 9B is a circuit diagram of an undervoltage lockout (UVLO) circuit 900b according to one embodiment. The UVLO circuit 900b can be a CMOS transistor level realization of a UVLO circuit such as the UVLO circuit 113 of FIG. 1C where the UVLO circuit 900b provides a control signal $V_{CPG}$ in response to a voltage level of the charge pump voltage $V_{CP}$. The UVLO circuit 900b includes an NMOS 950, an NMOS 956, an NMOS 960, a PMOS 966, a PMOS 968, a PMOS 970, a PMOS 964, a resistor 954, a resistor 952, a resistor 958, and a resistor 962, which form a core comparator circuit suitable for providing a temperature stable comparator output voltage $V_X$ as a function of the charge pump voltage $V_{CP}$. Details of this design and similar temperature stable comparators can be found in Applicant's U.S. Pat. No. 8,487,660 B2 entitled "Temperature-stable CMOS voltage reference circuits," published Jul. 16, 2013. The voltage $V_X$ transitions from a logic low (ground potential) to a logic high as the charge pump voltage $V_{CP}$ increases and exceeds a threshold determined by the core comparator circuit. A level shift circuit 972 translates a voltage level from voltages between ground and the charge pump voltage $V_{CP}$ to a level between ground and the supply voltage $V_S$. In this way the UVLO circuit 900b provides the control signal $V_{CPG}$ translated to a logic level of the supply voltage $V_S$. Those of ordinary skill in the art can appreciate the need for level shift circuits when there are two or more voltage levels, such as the charge pump voltage $V_{CP}$ and the supply voltage $V_S$.

Figure 10:
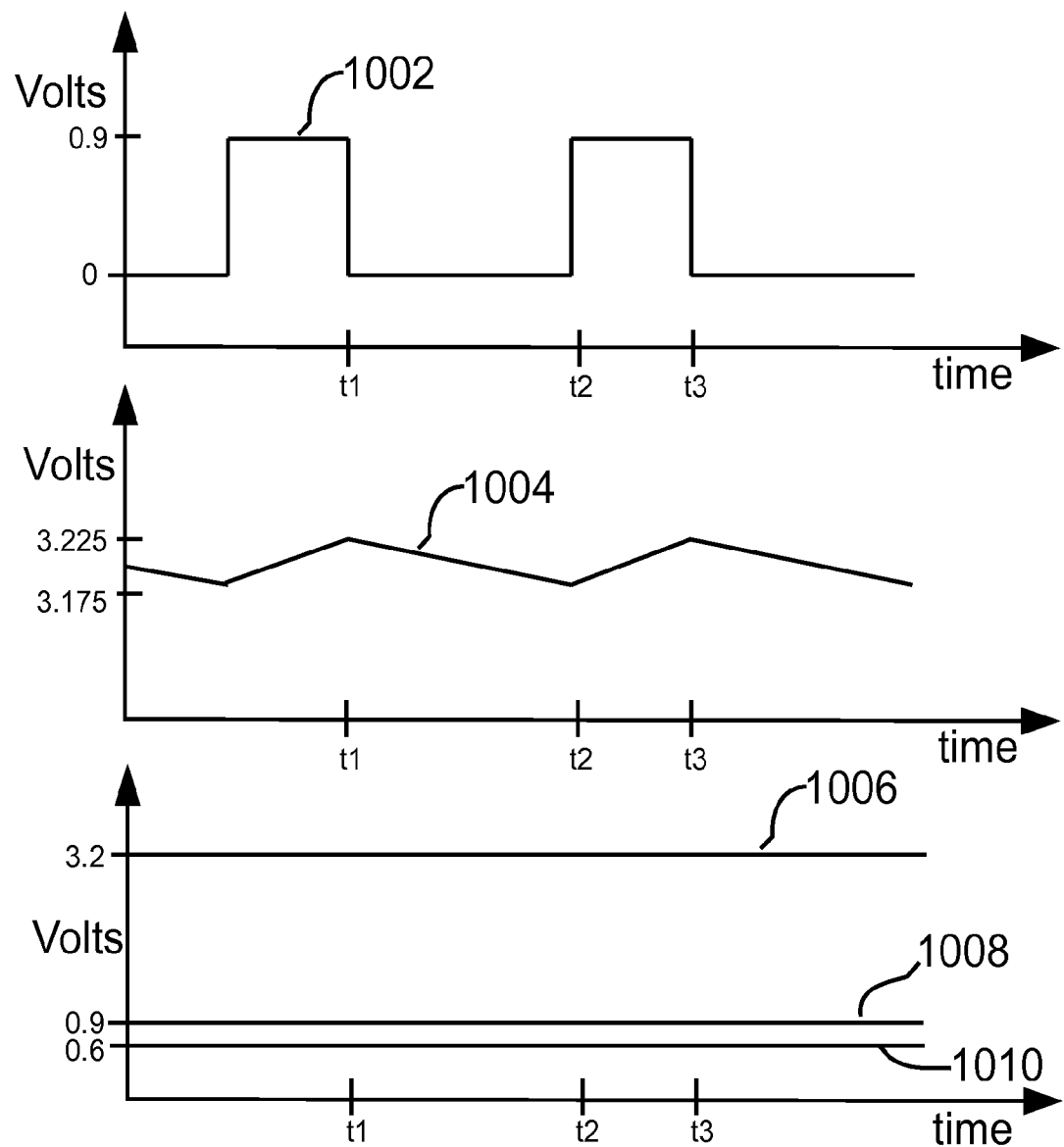
FIG. 10 shows three plots of waveforms of a regulated charge pump system operating in the steady state according to one embodiment.

FIG. 10 shows three plots of waveforms of a regulated charge pump system operating in the steady state according to one embodiment. The waveforms, also referred to as "traces", can represent waveforms of the regulated charge pump system 402a of FIG. 4A. With reference to the embodiment of FIG. 4A, the first plot shows a trace 1002 of the signal $V_{ECP}$ while the second plot shows a trace 1004 of the charge pump voltage $V_{CP}$. As can be seen in FIG. 10, the trace 1002 periodically switches high and low between 0.9V and 0V to control the charge pump 110 to periodically turn on and off. Also, as seen in FIG. 10, the trace 1004 is a sawtooth pattern representing a ripple component of the charge pump voltage $V_{CP}$ in the steady state. One period can be defined between time $t_1$ and time $t_3$ where between time $t_1$ and time $t_2$ the signal $V_{ECP}$ controls the charge pump 110 to be in an on or operating state; between time $t_2$ and time $t_3$ the signal $V_{ECP}$ is low so as to control the charge pump 110 to be in an off state As one of ordinary skill can appreciate, the waveforms are a result of the enabling and disabling of the charge pump 110 by the charge pump regulation control module 118. In the steady state the charge pump regulation control module 118 can use the steady state reference value to regulate the charge pump voltage $V_{OUT}$ to a controlled value which is a function of the steady state reference value. Also, as one of ordinary skill in the art can recognize, the ripple component can be a result of loading, also referred to as quiescent current demand, by circuit subsystem blocks such as the circuit subsystem 112 of FIG. 1D or such as the amplifier 412 and the second bias reference 214 of FIG. 4A.

Also shown in FIG. 10 is the combined plot of a trace 1006 of the charge pump voltage $V_{CP}$, a trace 1008 of the supply voltage $V_S$, and a trace 1010 of the output voltage $V_{OUT}$. In the steady state the charge pump voltage has an average value of about 3.2V and is regulated with respect to the steady state reference value according to a design configuration given by Equation 4. Here the ripple component discussed with respect to trace 1004 is not observed on the scale of the combined plot.

Trace 1008 and trace 1010 indicate that for supply voltages of 0.9V, the regulated charge pump system 402a of FIG. 4A can provide the output voltage $V_{OUT}$ equal to 0.6V. In this embodiment a design of the charge pump regulation control module 900a was based upon the following design parameters: the resistance RT equals 1.4 M (meg ohms); the resistance RB equals 400 K (Kohms); $V_{REF2}$ is a stable voltage equal to 0.55V; and $V_{RB}$ is a stable voltage equal to 0.6V. Also, the PMOS 908 of FIG. 9A provides a gate to source voltage $V_{GS}$ of about 0.675V. In comparison the traces 1002-1010, derived from circuit simulations, show simulation results agree with Equation 4.

Also as seen from the trace 1004, the simulation results show a ripple of less than 0.1V peak-to-peak. The ripple component is attributed to a quiescent demand or loading effect of about 120 uA (microamps) from circuit subsystem components on the charge pump 110. The simulation circuit also included an output filter capacitor, similar to the output filter capacitor 206 of FIG. 4A, with a capacitance of 10 nf. As one of ordinary skill in that art can appreciate, using higher values of capacitance can further reduce the ripple component of the charge pump output voltage $V_{CP}$.

Finally, the traces 1002-1010 of FIG. 10 show voltage levels and time scales for one embodiment having a specific design configuration; as one of ordinary skill in the art can appreciate, other configurations using different design values are possible.

Applications

Devices employing the above low voltage high PSRR systems can be implemented into various electronic devices. Examples of the electronic devices can include, but are not limited to, consumer electronic products, parts of the consumer electronic products, electronic test equipment, cell phones, laptops, etc. Examples of the electronic devices can also include circuits of optical networks or other communication networks. The consumer electronic products can include, but are not limited to, an automobile, a camcorder, a camera, a digital camera, a portable memory chip, a washer, a dryer, a washer/dryer, a copier, a facsimile machine, a scanner, a multifunctional peripheral device, etc. Further, the electronic device can include unfinished products, including those for industrial, medical, portable, and automotive applications.

The foregoing description and claims may refer to elements or features as being connected or coupled together. As used herein, unless expressly stated otherwise, connected means that one element/feature is directly or indirectly connected to another element/feature, and not necessarily mechanically. Likewise, unless expressly stated otherwise, coupled means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
   a supply node configured to receive an external supply voltage;
   a charge pump configured to convert the external supply voltage to a charge pump voltage;
   a circuit subsystem having a stage, wherein the stage is configured to receive the charge pump voltage at a stage supply node such that the charge pump provides a quiescent current to the stage, wherein the circuit subsystem is configured to provide an external output voltage at an external output node, wherein the circuit subsystem is configured to transition from a subsystem transient state to a subsystem steady state after the charge pump voltage is greater than a charge pump threshold value; and
   a charge pump regulation control module configured to select between coupling a state dependent reference having a transient state reference value that does not vary depending upon the external output voltage or coupling the state dependent reference having a steady state reference value and configured to regulate the charge pump voltage with respect to the state dependent reference, wherein the state dependent reference has the transient state reference value before the subsystem transitions to the subsystem steady state, and wherein the state dependent reference has the steady state reference value after the subsystem transitions to the subsystem steady state, and wherein the steady state reference value is provided by the external output voltage.

2. The apparatus of claim 1, wherein the transient state reference value is provided by the external supply voltage.

3. The apparatus of claim 1, wherein the charge pump voltage is positive.

4. The apparatus of claim 1, wherein the charge pump voltage is negative.

5. The apparatus of claim 1, wherein during the subsystem steady state, the charge pump voltage is substantially constant as a function of the external supply voltage for values of the external supply voltage between a first value and a second value, wherein the first value is less than one volt and the second value is greater than the charge pump voltage.

6. The apparatus of claim 1, wherein during the subsystem steady state, the external output voltage has a time varying steady state value.

7. The apparatus of claim 1, wherein the stage is an amplifier and the circuit subsystem comprises a regulator configured to provide the external output voltage.

8. The circuit subsystem of claim 7, wherein the regulator is a linear regulator.

9. The apparatus of claim 1, wherein the circuit subsystem comprises an undervoltage lockout circuit configured to enable the circuit subsystem based upon a threshold level of the charge pump voltage.

10. The apparatus of claim 1, wherein the circuit subsystem and the charge pump are part of an integrated circuit.

11. An apparatus comprising:
    a supply node configured to receive an external supply voltage;

an external output node configured to provide an external output voltage;

an amplifier comprising an amplifier supply node and an amplifier output port:

an N-channel field effect transistor (NFET) having a gate electrically coupled to the amplifier output port, a drain electrically coupled to the external supply node, and a source electrically coupled to the external output node;

a charge pump configured to convert the external supply voltage to a charge pump voltage and to provide the charge pump voltage to the amplifier supply node so as to substantially reject variations in the external output voltage due to variations in the external supply voltage;

a circuit subsystem comprising the amplifier and the NFET, wherein the circuit subsystem is configured to operate in a transient state and a steady state, and wherein the external output voltage reaches a steady state output value in the steady state; and a charge pump regulation control module configured to select between coupling a state dependent reference having a transient state reference value that does not vary depending upon the external output voltage or coupling the state dependent reference having a steady state reference value and configured to regulate the charge pump voltage with respect to the external output voltage in the steady state.

12. The apparatus of claim 11, wherein the charge pump voltage is positive.

13. The apparatus of claim 11, wherein the charge pump voltage is negative.

14. The apparatus of claim 11, wherein during the steady state, the charge pump voltage is a function of the external output voltage and substantially independent of the external supply voltage for values of the external supply voltage between a first value and a second value, wherein the first value is less than one volt, and the second value is greater than the charge pump voltage.

15. The apparatus of claim 11 further comprising:

a load electrically coupled to the external output node;

wherein in the steady state, the external output voltage has time varying perturbations due to changes in the load.

16. The apparatus of claim 11, wherein the circuit subsystem comprises a regulator configured to regulate the external output voltage with respect to a bandgap reference.

17. The circuit subsystem of claim 16, wherein the regulator is a linear regulator.

18. The apparatus of claim 11, wherein the circuit subsystem comprises an undervoltage lockout circuit configured to enable the circuit subsystem based upon a threshold level of the charge pump voltage.

19. The apparatus of claim 11, wherein the circuit subsystem and the charge pump are part of an integrated circuit.

* * * * *